United States Patent
Kurihara et al.

(10) Patent No.: US 9,455,390 B2
(45) Date of Patent: Sep. 27, 2016

(54) SEMICONDUCTOR DEVICE, METHOD FOR MANUFACTURING SEMICONDUCTOR DEVICE AND ELECTRONIC THERMOELECTRIC POWER GENERATION DEVICE

(71) Applicant: FUJITSU LIMITED, Kawasaki-shi, Kanagawa (JP)

(72) Inventors: Kazuaki Kurihara, Atsugi (JP);
Osamu Tsuboi, Kawasaki (JP);
Norinao Kouma, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/683,577

(22) Filed: Apr. 10, 2015

(65) Prior Publication Data

US 2015/0214461 A1    Jul. 30, 2015

Related U.S. Application Data

(63) Continuation of application No. PCT/JP2012/077266, filed on Oct. 22, 2012.

(51) Int. Cl.
*H01L 23/00* (2006.01)
*H01L 35/32* (2006.01)
(Continued)

(52) U.S. Cl.
CPC ............ *H01L 35/32* (2013.01); *H01L 25/16* (2013.01); *H01L 35/16* (2013.01); *H01L 35/34* (2013.01); *H01L 2924/0002* (2013.01)

(58) Field of Classification Search
CPC .................................................... H01L 35/32
See application file for complete search history.

(56) References Cited

U.S. PATENT DOCUMENTS 5,956,569 A * 9/1999 Shiu ..................... H01L 23/38
136/200
2007/0256722 A1    11/2007 Kondoh

FOREIGN PATENT DOCUMENTS

| JP | H03-196583 | 8/1991 |
| JP | H11-274592 | 10/1999 |

(Continued)

OTHER PUBLICATIONS

Nikkei Electronics; "Advancements in Energy Conservation for Ambient Power Generation, Operable at 1 μW or less;" Sep. 19, 2011 (pp. 73-80, 2 end Sheets and 1 Sheet translation, 11 Sheets total).

(Continued)

*Primary Examiner* — William Harriston
(74) *Attorney, Agent, or Firm* — Kratz, Quintos & Hanson LLP

(57) ABSTRACT

The invention relates to a semiconductor device, a method for manufacturing a semiconductor device and an electronic thermoelectric power generation device, a semiconductor device having a thermoelectric conversion element that is embedded in a semiconductor chip so as to be integrated with a semiconductor circuit can be implemented. A semiconductor substrate is provided with a through opening for a region in which a thermoelectric conversion element is to be formed, and a thermoelectric conversion element is embedded in the through opening, where the thermoelectric conversion element includes: a number of penetrating rods made of a thermoelectric conversion material; and an insulating reinforcement layer in which the penetrating rods are embedded and of which the thermal conductivity is lower than that of the thermoelectric conversion material.

18 Claims, 35 Drawing Sheets

(51) Int. Cl.
*H01L 35/34* (2006.01)
*H01L 35/16* (2006.01)
*H01L 25/16* (2006.01)

(56) References Cited

FOREIGN PATENT DOCUMENTS

| | | |
|---|---|---|
| JP | 2005-340479 A1 | 12/2005 |
| JP | 2006-19422 A1 | 1/2006 |
| JP | 2010-283130 A1 | 12/2010 |
| JP | 2011-64513 A1 | 3/2011 |
| JP | 2012-19205 A1 | 1/2012 |

OTHER PUBLICATIONS

Written Opinion issued for PCT/JP2012/077266 dated Jan. 22, 2013 (5 Sheets and 3 Sheets translation, 8 Sheets total).
International Search Report for International Application No. PCT/JP2012/077266 dated Jan. 22, 2013.
Japanese Office Action issued for corresponding Japanese patent application No. 2014-543023, mailed Dec. 1, 2015, with partial translation.

\* cited by examiner

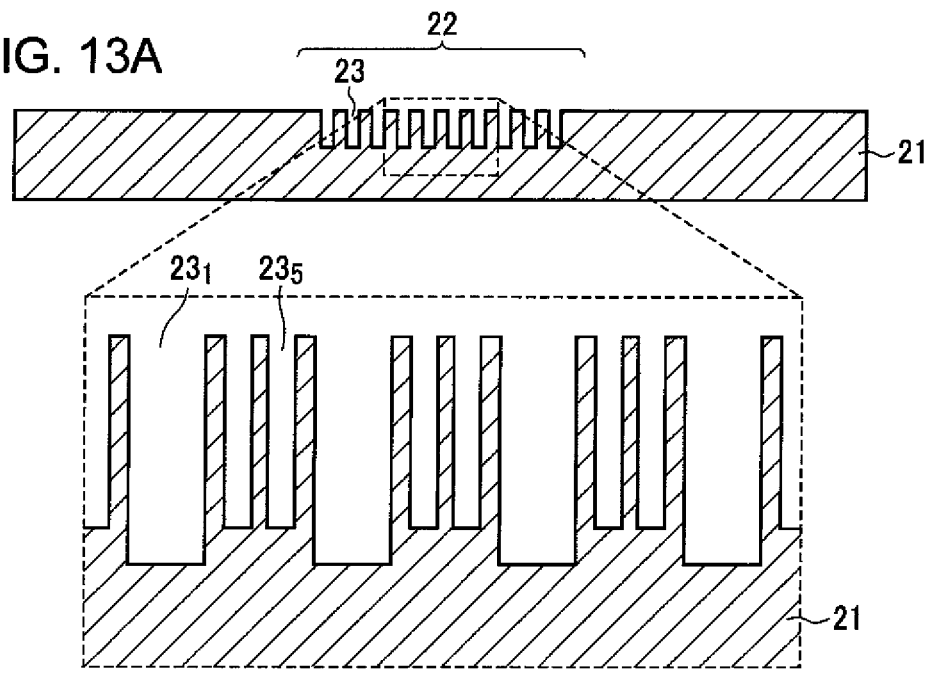
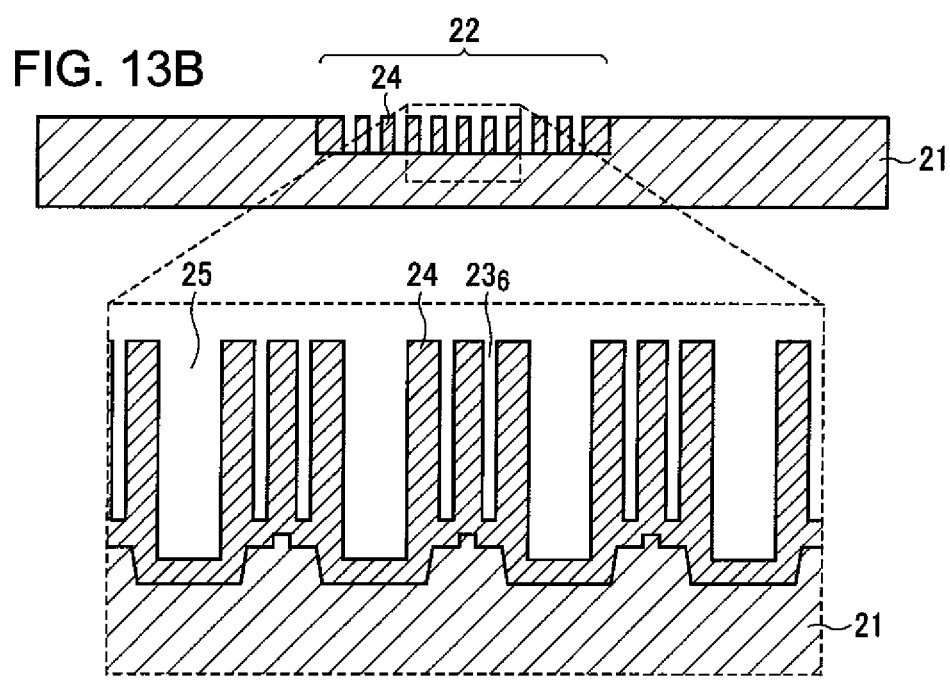

SEMICONDUCTOR DEVICE, METHOD FOR MANUFACTURING SEMICONDUCTOR DEVICE AND ELECTRONIC THERMOELECTRIC POWER GENERATION DEVICE

CROSS-REFERENCE TO RELATED APPLICATION

This application is a continuation application of International Application Number PCT/JP2012/077266 filed on Oct. 22, 2012 and designated the U.S., the entire contents of which are incorporated herein by reference.

FIELD

The present invention relates to a semiconductor device, a method for manufacturing a semiconductor device and an electronic thermoelectric power generation device, and in particular, to a method for manufacturing a semiconductor device having a thermoelectric conversion element within a semiconductor substrate and an electronic thermoelectric power generation device.

BACKGROUND

Energy harvesting technologies for converting ambient sparse energy to power, which is used for the power supply of electronic devices have been attracting attention as technologies according to which sensor nodes for forming a sensor network society of which the market is considered to expand greatly in the future can be realized in a battery-less form.

The future image of the sensor network is a human friendly information-oriented society where innumerable microminiature wireless sensor nodes are provided in a given environment and a massive amount of data from these sensors is processed and fed back to people as information that is useful for making people feel at ease and providing them with a sense of security.

A vast number of wireless sensors are used here, and therefore the wireless sensors are required to be of a self-generating type. Furthermore, it is necessary for the wireless sensors to be so small that the existence of the wireless sensors has no effect on the environment, and thus it is desired to implement a self-generating wireless sensor of which the size is on a scale of millimeters or smaller.

A possible example is an implant-type sensor node that is implanted in an animal or human body so as to generate power from vibration or body heat and transmits a wireless signal containing information on the organism. In order to implement such microscopic electronic devices at a low cost, an ambient power-generating element that is integrated with a semiconductor circuit such as a Si electronic circuit is required.

Ambient power-generating systems include those that use light, vibration or heat. One system that uses light is a solar battery, which can be easily integrated into a semiconductor circuit. As for vibration-powered generation, many reports on Si-based vibration-powered generators using MEMS technology have been issued proving that it is still possible to integrate a vibration-powered generator with a Si circuit.

CITATION LIST

Patent Literature

Patent Document 1: Japanese Unexamined Patent Publication H11 (1999)-274592

Non-Patent Literature

Non-Patent Document 1: Nikkei Electronics, "Advancements in Energy Conservation for Ambient Power Generation, Operable at 1 µW or less," Sep. 19, 2011

However, there are no reports on the integration of a thermoelectric generator element with a semiconductor circuit such as a Si circuit. While a method for forming a thermoelectric element on a substrate that is made of Si or the like and a method for forming a thermoelectric element using a Si substrate as a frame by creating a hole in the substrate have been reported (See Patent Document 1), there are limits to the possible extent of miniaturization and to the effectiveness of the thermoelectric element.

SUMMARY

According to one aspect of the disclosed invention, a semiconductor device is provided with: a semiconductor substrate having a through opening for a region in which a thermoelectric conversion element is to be formed; and a thermoelectric conversion element embedded in the through opening, characterized in that the thermoelectric conversion element includes: a number of penetrating rods made of a thermoelectric conversion material; and an insulating reinforcement layer in which the penetrating rods are embedded and of which the thermal conductivity is lower than that of the thermoelectric conversion material.

According to another aspect of the disclosed invention, a thermoelectric generator device is provided with: a semiconductor substrate having a through opening for a region in which a thermoelectric conversion element is to be formed; and a thermoelectric conversion element embedded in the through opening, characterized in that the thermoelectric conversion element includes: a number of penetrating rods made of a thermoelectric conversion material; an insulating reinforcement layer in which the penetrating rods are embedded and of which the thermal conductivity is lower than that of the thermoelectric conversion material; and a semiconductor circuit formed of the semiconductor substrate, and the thermoelectric generator device is further provided with: an electronic part mounted on at least either a main surface or a rear surface of the semiconductor substrate; a heat insulator that coats the electronic part; heat incoming/outgoing radiators formed on the main surface and rear surface sides of the semiconductor substrate; and a heat conductor for thermally connecting at least one of the heat incoming/outgoing radiators to the thermoelectric conversion element.

According to still another aspect of the disclosed invention, a method for manufacturing a semiconductor device is provided with the formation of a number of rods of a thermoelectric conversion material on a front surface side of a region of a semiconductor wafer in which a thermoelectric conversion element is to be formed; and the coverage of the rods with an insulating reinforcement layer of which the thermal conductivity is lower than that of the semiconductor wafer.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 13A and 13B are diagrams for illustrating a step in the middle of the manufacturing process for the electronic thermoelectric power generation device according to Example 8 of the present invention;

FIGS. 17E and 17F are diagrams for illustrating a step after the step in

FIG. 17D of the manufacturing process for the electronic thermoelectric power generation device according to Example 10 of the present invention;

DESCRIPTION OF EMBODIMENTS

Figure 1A:
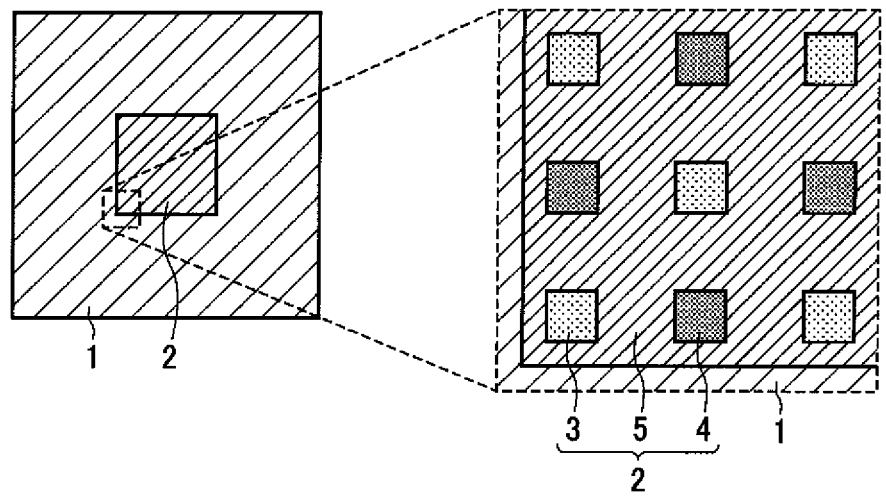
FIGS. 1A and 1B are diagrams illustrating the electronic thermoelectric power generation device according to the present invention in the chip stage.
Figure 1B:
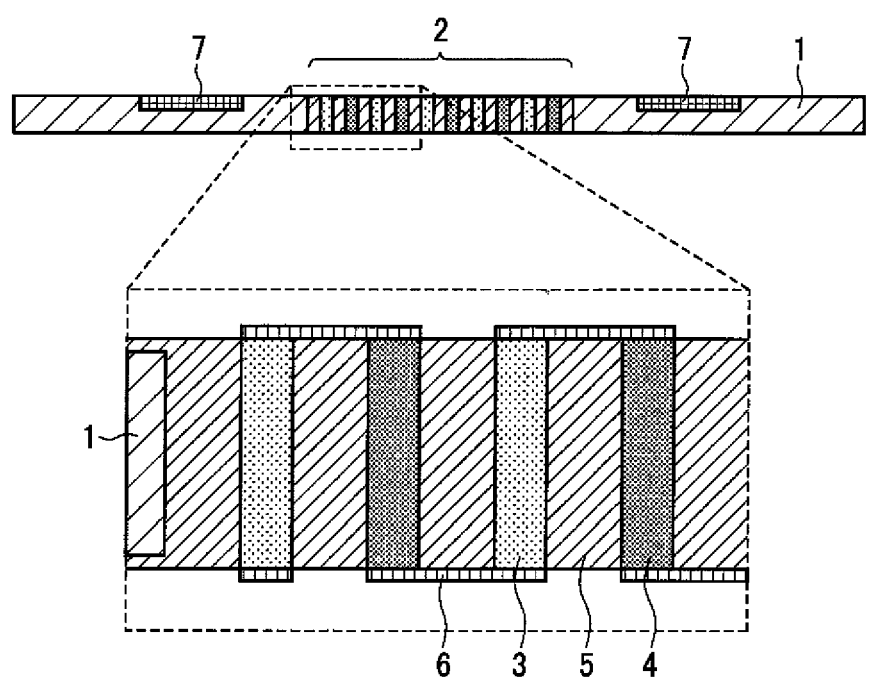

Here, the electronic thermoelectric power generation device according to an embodiment of the present invention is described in reference to FIGS. 1A to 2B. FIGS. 1A and 1B are diagrams illustrating the electronic thermoelectric power generation device according to the present invention in the chip stage. FIG. 1A is a schematic plan diagram and FIG. 1B is a schematic cross-sectional diagram. As illustrated in the figures, a thermoelectric conversion element 2 is embedded in the through opening of a semiconductor substrate 1 having a through opening for a region in which a thermoelectric conversion element is to be formed. The thermoelectric conversion element has a number of penetrating rods 3 and 4 made of a thermoelectric conversion material and an insulating reinforcement layer 5 in which the penetrating rods 3 and 4 are embedded and of which the thermal conductivity is lower than that of the semiconductor substrate 1. In addition, a semiconductor circuit 7, such as a sensor element, is formed on the semiconductor substrate 1.

Thermoelectric power generation is a phenomenon where an electromotive force is generated in a thermoelectric conversion material due to the difference in temperature between the two ends of the material itself and thus power is gained. The electromotive force of the thermoelectric power generation is small and therefore it is necessary to provide a number of penetrating rods 3 and 4 made of P type and N type thermoelectric bodies alternately in a two-dimensional matrix form and connect them in series through connection wires 6 in order to increase the output voltage of the device as a whole.

Even in a microscopic device on a scale of mm, several hundreds to several tens of thousands of penetrating rods 3 and 4 must be formed of thermoelectric materials so as to penetrate through the thermoelectric conversion element 2 from the front to the rear. In order to maximize the output to the thermoelectric power generation, it is also necessary to make the penetrating rods 3 and 4 as long as possible for the purpose of making the difference in temperature between the two ends of the penetrating rods 3 and 4 as great as possible. Therefore, it is desirable for the penetrating rods 3 and 4 to have a high aspect ratio where the width is narrow and the length is long.

It is possible to provide a thermoelectric conversion element by creating microscopic holes in a semiconductor substrate 1 and filling the holes with a thermoelectric conversion material. However, the thermal conductivity of semiconductors is vastly greater than the thermal conductivity of thermoelectric conversion materials and therefore a reinforcement layer 5 having a low thermal conductivity is required. Incidentally, the thermal conductivity of Si is approximately 170 W/mK and the thermal conductivity of BiTe, which is a thermoelectric conversion material, is approximately 2 W/mK. Accordingly, when the heat flux flows between the front and the rear of the electronic device that includes a semiconductor region most of the thermal flux flows through the semiconductor region and not through the thermoelectric material, which does not create a difference in temperature within the thermoelectric material rods, making the power output small.

When the reinforcement layer 5 having a low thermal conductivity is provided around the penetrating rods 3 and 4 made of a thermoelectric conversion material, heat flux flows into the penetrating rods 3 and 4 so as to create a large difference in temperature and thus a large output of thermoelectric power generation can be gained. Incidentally, the thermal conductivity of thermally oxidized $SiO_2$ is approximately 1 W/mK, which is 1/100 or less of Si. When microscopic gaps are created in the reinforcement layer 5, heat conduction in this region can be further reduced so as to increase the power output.

The reinforcement layer 5 may be made of a highly rigid insulating material of which the thermal conductivity is lower than that of the semiconductor substrate 1. In the case where the semiconductor substrate 1 is a silicon substrate, the reinforcement layer 5 may be formed of thermally oxidized $SiO_2$ or a deposited insulating film, such as CVD-$SiO_2$, SiON, SiN or parylene. In the case where the semiconductor substrate 1 is a compound semiconductor substrate, such as a GaAs chip, the reinforcement layer 5 may be formed of a deposited insulating film, such as CVD-$SiO_2$, SiON, SiN or parylene. Here, the method for forming a deposited insulating film may be a CVD method, a spattering method or an aerosol deposition method.

In the case where thermally oxidized $SiO_2$ is used, first deep trenches, and second deep trenches of which the width is narrower than that of the first deep trenches, are created in a silicon chip and the portions of the first deep trenches that remain after thermal oxidation are used as trenches for rods, and thus these remaining trenches are filled in with a thermoelectric conversion material. At this time, the second deep trenches may be completely filled in with a thermal oxide film or gaps may be left. Here, a semiconductor region may remain inside the reinforcement layer 5.

In addition, the first and second deep trenches may be created on the two surfaces, front and rear, of the silicon chip. In this case, the aspect ratio of the penetrating rods 3 and 4 becomes high where the height of the penetrating rods 3 and 4 is great, and therefore the output of thermoelectric power generation can be made greater. Also in this case, the first deep trenches are in the form of a long hourglass-shaped hand drum and accordingly the penetrating rods 3 and 4 are also in the form of a long hourglass-shaped hand drum, which prevents the penetrating rods 3 and 4 from coming out. Here, it is not necessary for the second deep trenches to penetrate through the silicon chip.

In the case where a deposited insulating film is used for the reinforcement layer 5, a deep trench may be created in the semiconductor substrate 1 and this deep trench may be filled in with a thermoelectric conversion material, after which the surrounding semiconductor region may be removed through etching and an insulating film may be deposited in this portion from which the semiconductor region has been removed.

In the case where gaps are provided in the deposited insulating film, gaps that are not in slit form may be provided between penetrating rods 3 and 4 that are adjacent to each other in the direction in which the penetrating rods 3 and 4 are aligned in a two-dimensional matrix form. Alternatively, gaps that are not in slit form may be provided between penetrating rods 3 and 4 that are adjacent to each other in a diagonal direction in a two-dimensional matrix form where the penetrating rods 3 and 4 are aligned. Furthermore, a large peripheral gap may be created between the surrounding semiconductor substrate 1 and the reinforcement layer 5.

As for the thermoelectric conversion material, a typical example of an N type thermoelectric material is a BiTe based alloy, such as $Bi_2Te_3$ and a typical example of a P type thermoelectric material is a BiTe based alloy, such as $Bi_{0.3}Sb_{1.7}Te_3$, but other BiTe type materials (BiTe, SbTe, BiSe or compounds of these) may be used. In addition, chromel of which the main components are Ni and Cr may be used as the P type thermoelectric material and constantan of which the main components are Cu and Ni may be used as the N type thermoelectric material.

Alternatively, PbTe type materials (PbTe, SnTe, AgSbTe, GeTe or compounds of these), Si-Ge based materials (Si, Ge, SiGe), silicide based materials (FeSi, MnSi, CrSi), skutterudite based materials (compounds represented by $MX_3$ or $RM_4X_{12}$, where M equals Co, Rh or Ir and X equals As, P or Sb and R equals La, Yb or Ce), transition metal oxides (NaCoO, CaCoO, ZnInO, SrTiO, BiSrCoO, PbSrCoO, CaBiCoO, BaBiCoO), zinc antimony based compounds (ZnSb), boron compounds (CeB, BaB, SrB, CaB, MgB, VB, NiB, CuB, LiB) and the like may be used.

Figure 2A:
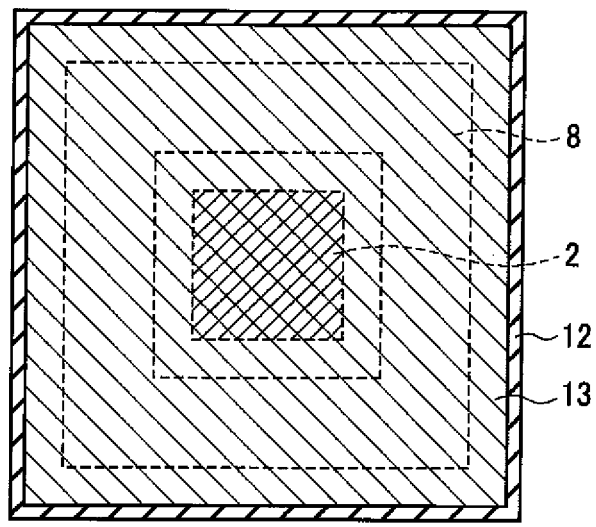
FIGS. 2A and 2B are diagrams illustrating the electronic thermoelectric power generation device according to the present invention.
Figure 2B:
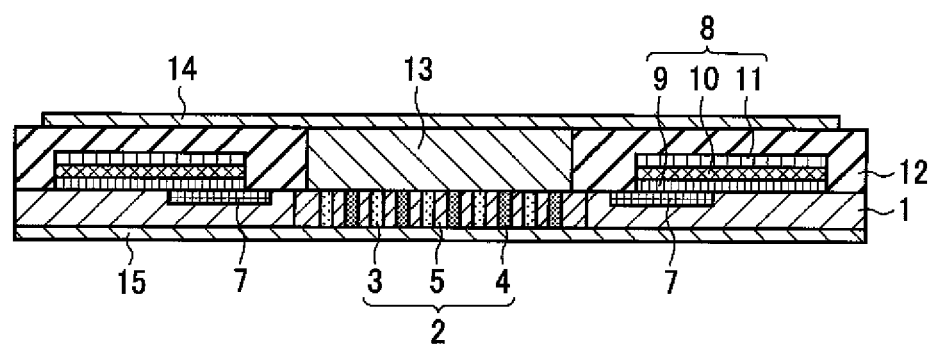

Next, the electronic thermoelectric power generation device according to an embodiment of the present invention is described in reference to FIGS. 2A and 2B. FIG. 2A is a schematic plan diagram illustrating the electronic thermoelectric power generation device according to an embodiment of the present invention and FIG. 2B is a schematic cross-sectional diagram. This electronic thermoelectric power generation device is gained by mounting an electronic part such as an all-solid-state secondary battery 8 on the semiconductor substrate 1 in which the thermoelectric conversion element in FIG. 1 is embedded. In this case, the all-solid-state secondary battery 8 is formed by layering a first electrode 9, a solid electrolyte 10 and a second electrode 11 of which the polarity is opposite to that of the first electrode 9 on top of each other in this order. A typical example of the all-solid-state secondary battery 8 is an all-solid-state Li ion battery but an all-solid-state Na ion battery, an all-solid-state Ca ion battery or an all-solid-state Mg ion battery may be used.

This electronic part, such as the all-solid-state secondary battery 8, is coated with a heat insulator 12 made of a heat insulating material such as a foamed polyolefine-based heat insulating resin. At the same time, a heat conductor 13 is provided at least either on the front or on the rear of the thermoelectric conversion element 2 so as to make thermal contact thereon and heat incoming/outgoing radiators 14 and 15 are provided on the front and the rear of the thermoelectric conversion element 2. The electronic part, such as the all-solid-state secondary battery 8, is provided at least either on the front or on the rear of the semiconductor substrate 1. The heat conductor 13 may be formed of a substance having a high heat conductivity, such as Cu. The heat incoming/outgoing radiators 14 and 15 are also formed of a substance having a high heat conductivity, such as Cu or Al, and it is desirable to further provide a thin film such as Ti on the surface thereof in order to prevent oxidation or increase biocompatibility. In addition, the heat incoming/outgoing radiator on the heat releasing side may be provided with protrusions in the form of fins in order to increase the efficiency of heat release. Here, the side on which the semiconductor circuit 7 is provided is usually the heat releasing side.

In the case where this electronic thermoelectric power generation device is used as a sensor such as a thermoelectric power generating wireless temperature sensor, a temperature sensor, a signal transmitter, a signal processing circuit and the like may be formed in the semiconductor circuit 7. In addition, the electronic part is not limited to the all-solid-state secondary battery 8, and a part such as a semiconductor element, a sensor element or a passive element may be mounted.

According to the embodiment of the present invention, a thermoelectric conversion element having a large output of thermoelectric power generation can be formed within a semiconductor substrate so as to penetrate through the semiconductor substrate. In addition, a self-generating electronic device that does not require a change of batteries can be implemented by mounting an all-solid-state secondary battery.

According to the disclosed semiconductor device, the disclosed method for manufacturing a semiconductor device and the disclosed electronic thermoelectric power generation device, a semiconductor device having a thermoelectric conversion element that is embedded in a semiconductor substrate so as to be integrated with a semiconductor circuit can be implemented. As a result, a self-generating electronic device that does not require a change of batteries can be made possible by using this thermoelectric conversion element.

EXAMPLE 1

Next, the electronic thermoelectric power generation device according to Example 1 of the present invention is described in reference to FIGS. 3A to 4H.

Figure 3A:
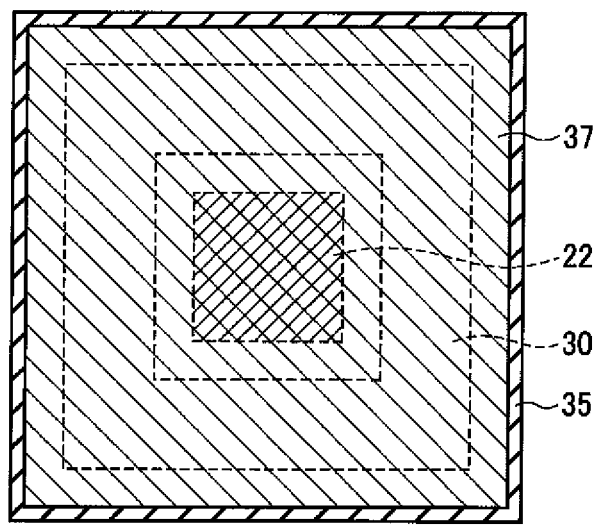
FIGS. 3A and 3B are diagrams illustrating the electronic thermoelectric power generation device according to Example 1 of the present invention.
Figure 3B:
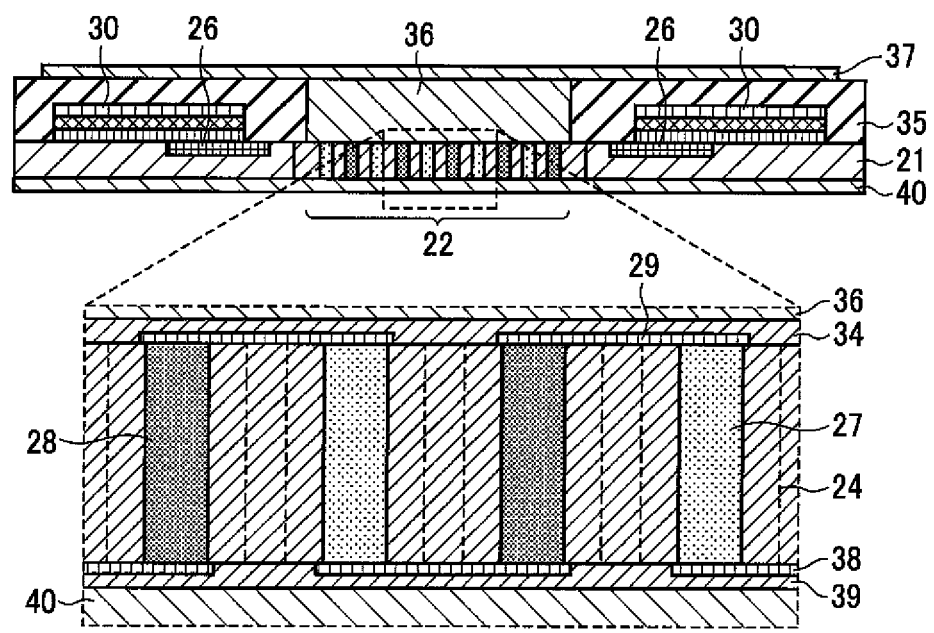

FIGS. 3A and 3B are diagrams illustrating the electronic thermoelectric power generation device according to Example 1 of the present invention. FIG. 3A is a schematic plan diagram and FIG. 3B is a schematic cross-sectional diagram. As illustrated in the figures, a region 22 of 1 mm×1 mm in which a thermoelectric conversion element is to be formed is provided in the center portion of a silicon wafer 21 and an all-solid-state Li ion battery 30 is provided so as to surround this region 22 in which a thermoelectric conversion element is to be formed.

The region 22 in which a thermoelectric conversion element is to be formed is provided with N type thermoelectric bodies 27 and P type thermoelectric bodies 28 that are alternately aligned in a two-dimensional matrix form and with an oxide wall 24 in which they are embedded. In addition, the N type thermoelectric bodies 27 and the P type thermoelectric bodies 28 are connected in series through connection wires 29 and connection wires 38 on the upper and lower exposed surfaces, respectively, so as to form a thermoelectric conversion element.

A heat incoming/outgoing radiator 37 is provided on the surface side of the thermoelectric conversion element with a heat conductor 36 in between and a rear heat incoming/outgoing radiator 40 is provided on the rear surface side. Here, an insulating film 34 is provided between the heat conductor 36 and the thermoelectric conversion element, and an insulating film 39 is provided between the thermoelectric conversion element and the rear heat incoming/outgoing radiator 40.

Figure 4A:
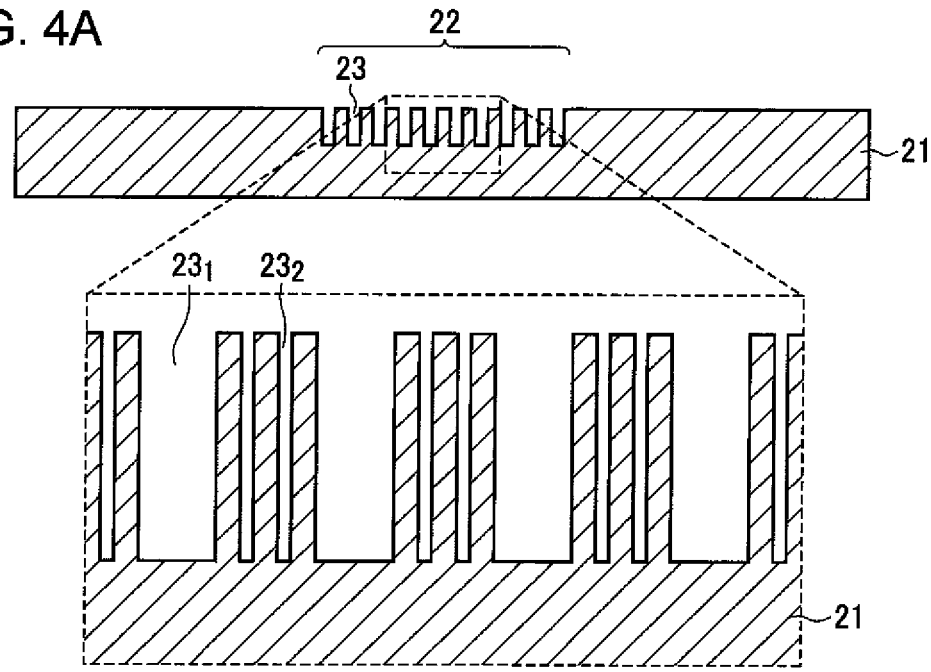
FIGS. 4A and 4B are diagrams for illustrating a step in the middle of the manufacturing process for the electronic thermoelectric power generation device according to Example 1 of the present invention.

Next, the process for manufacturing the electronic thermoelectric power generation device according to Example 1 of the present invention is described in reference to FIGS. 4A to 4H. First, as illustrated in FIG. 4A, slits 23 are created in the region 22 in which a thermoelectric conversion element is to be formed, which is a region of 1 mm×1 mm in the center portion of a silicon wafer 21, in accordance with Si deep reactive ion etching (RIE) method. As illustrated in the enlarged diagram, these slits 23 include recesses 23₁ to be filled in, which have a width of 10 μm and a depth of 30 μm, and slits 23₂ for the formation of thermally oxidized $SiO_2$, which have a width of 1 μm and a depth of 30 μm.

Figure 4B:
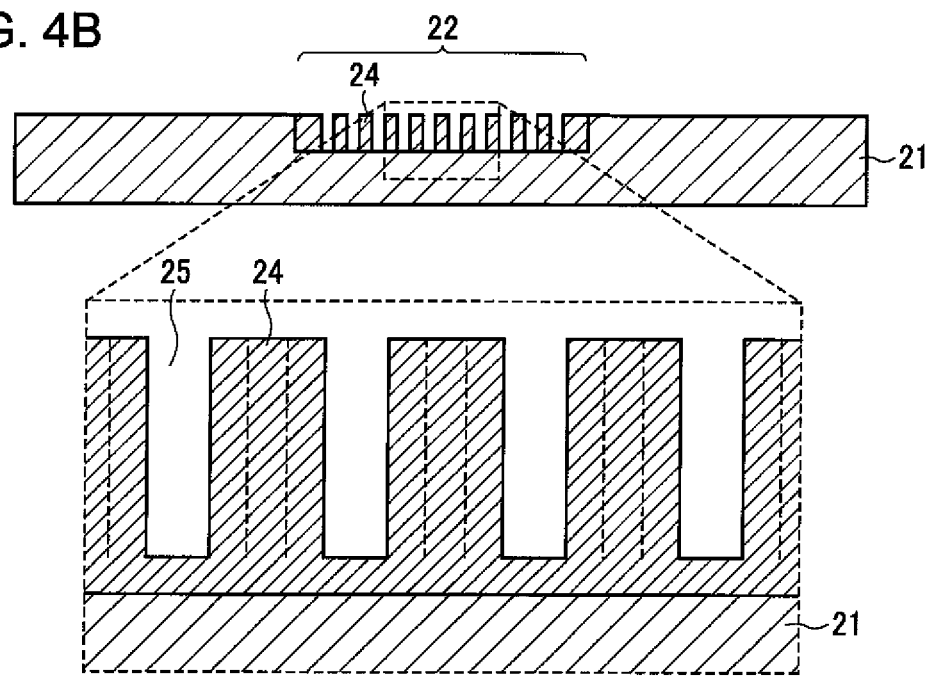

Next, as illustrated in FIG. 4B, thermal oxidation is carried out in a high temperature wet atmosphere at 1100° C. so that Si in the region 22 in which a thermoelectric conversion element is to be formed and slits 23 have been created is completely converted to thermally oxidized $SiO_2$, forming an oxide wall 24. At this time, the recesses 23₁ to be filled in are converted to recesses 25 to be filled in, of which the width is narrower by approximately 1 μm due to volume expansion resulting from oxidization, and the slits 23₂ completely disappear. While the surface of the silicon wafer 21 is oxidized, this is not shown.

Figure 4C:
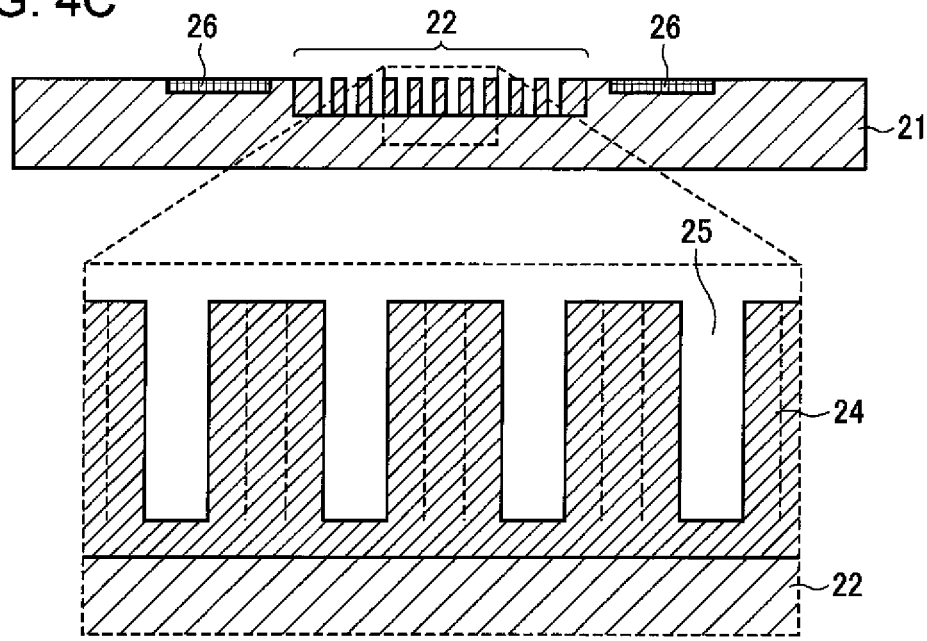
FIGS. 4C and 4D are diagrams for illustrating a step after the step in FIG. 4B of the manufacturing process for the electronic thermoelectric power generation device according to Example 1 of the present invention.

Next, as illustrated in FIG. 4C, a semiconductor circuit 26 that includes a temperature sensor, a low-power wireless circuit, a signal processing circuit, a boosting circuit, a charging and discharging circuit and the like is formed on the silicon wafer 21 in accordance with a conventional semiconductor process.

Figure 4D:
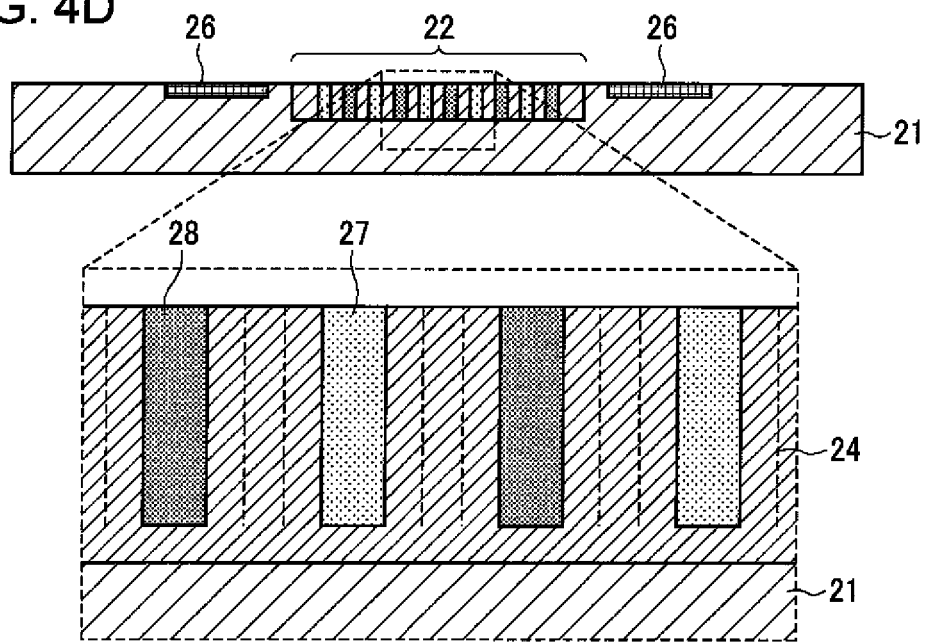

Next, as illustrated in FIG. 4D, the recesses 25 to be filled in are alternatively filled in with particles of a P type thermoelectric conversion material ($Bi_{0.3}Sb_{1.7}Te_3$) and an N type thermoelectric conversion material ($Bi_2Te_3$), using a metal mask in accordance with an aerosol deposition method. Next, annealing is carried out at 450° C. so as to form N type thermoelectric bodies 27 and P type thermoelectric bodies 28 in rod form.

Figure 4E:
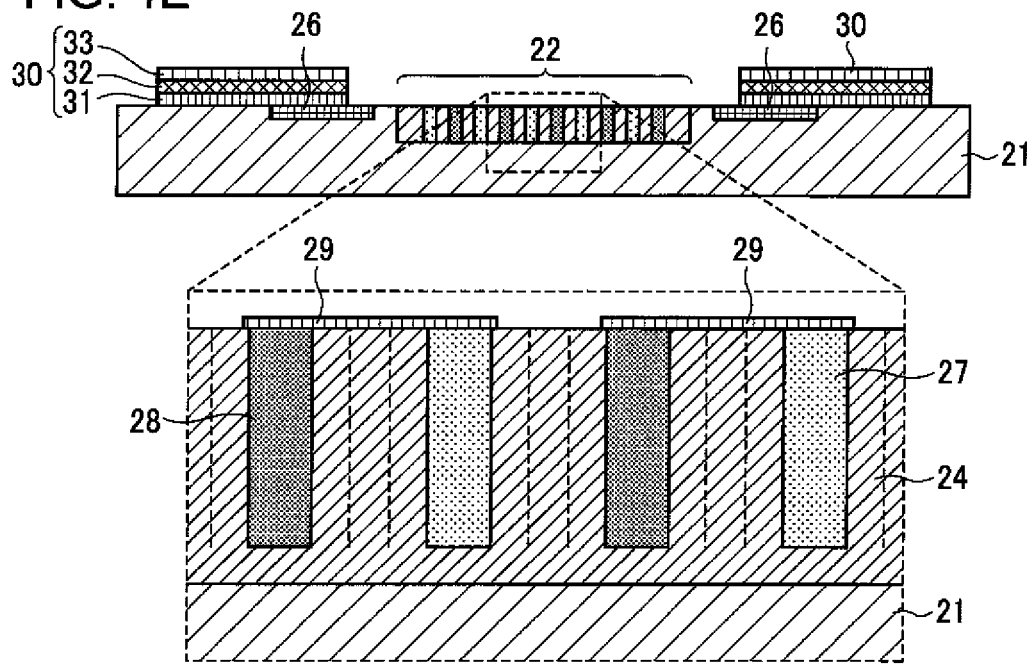
FIGS. 4E and 4F are diagrams for illustrating a step after the step in FIG. 4D of the manufacturing process for the electronic thermoelectric power generation device according to Example 1 of the present invention.

Next, as illustrated in FIG. 4E, connection wires 29 are formed of Cu in order to connect the N type thermoelectric bodies 27 and the P type thermoelectric bodies 28. Next, an all-solid-state Li ion battery 30 having a size of 1.8 mm×1.8 mm is formed outside the region 22 of 1 mm×1 mm in which a thermoelectric conversion element is to be formed. The all-solid-state Li ion battery 30 is formed of a cathode 31 made of $LiCo_2$, a solid electrolyte 32 made of LiPON and an anode 33 made of Li through spattering in this order. Though not shown, current collectors are formed of Pt so as to be connected to the cathode 31 and the anode 33, respectively.

Figure 4F:
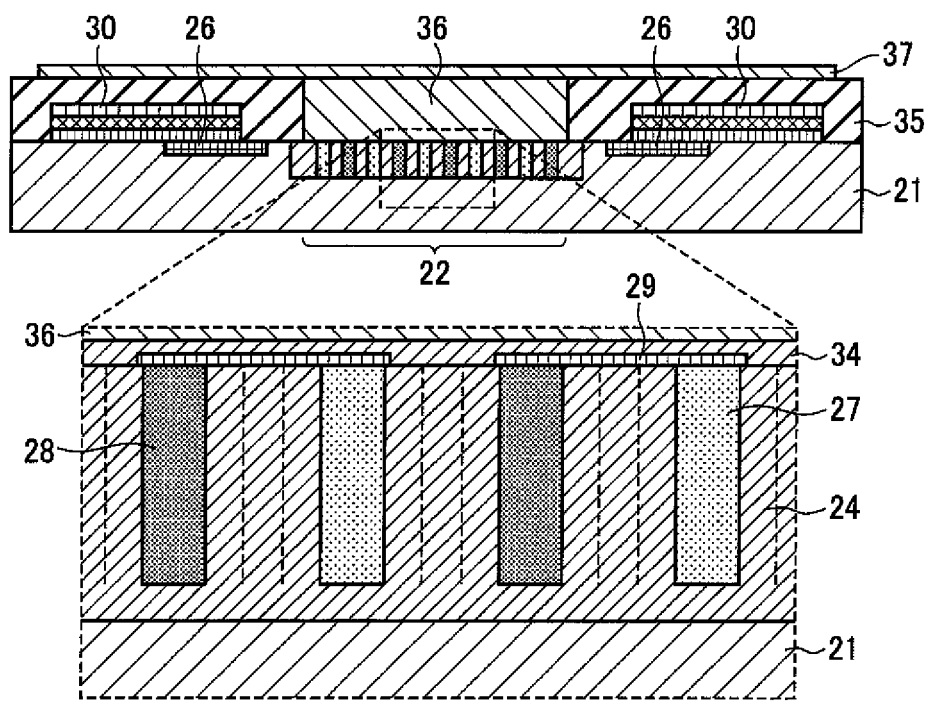

Next, as illustrated in FIG. 4F, an insulating film 34 is formed of alumina in accordance with a spattering method. Subsequently, the surface is coated with a foamed polyolefine-based heat insulating resin having a thickness of about 0.5 mm, and after that a recess is created through laser drilling so as to expose the major portion of the region 22 in which a thermoelectric conversion element is to be formed, where the remaining portion is a heat insulator 35. Next, a heat conductor 36 with which the recess is filled in is formed in accordance with an electroless Cu plating method. Next, a Cu plating film that coats approximately the entire surface is formed and a thin Ti film is formed on the surface in accordance with a spattering method so as to provide a heat incoming/outgoing radiator 37.

Figure 4G:
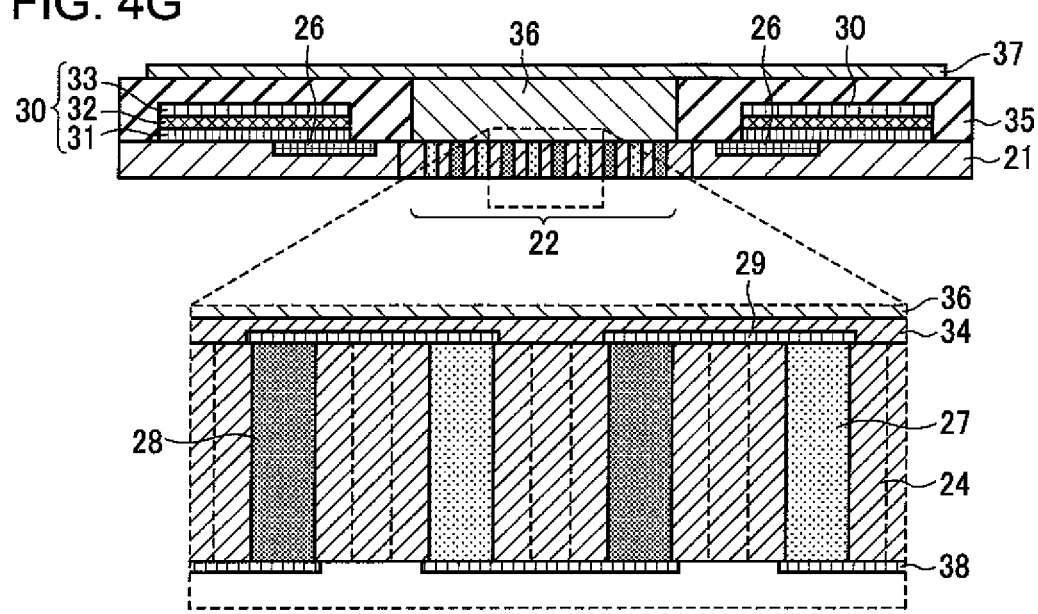
FIGS. 4G and 4H are diagrams for illustrating a step after the step in FIG. 4F of the manufacturing process for the electronic thermoelectric power generation device according to Example 1 of the present invention.

Next, as illustrated in FIG. 4G, the rear surface of the silicon wafer 21 is polished according to a mechanical polishing method so that the thickness is reduced to 30 μm and the N type thermoelectric bodies 27 and the P type thermoelectric bodies 28 are exposed from the rear surface.

Figure 4H:
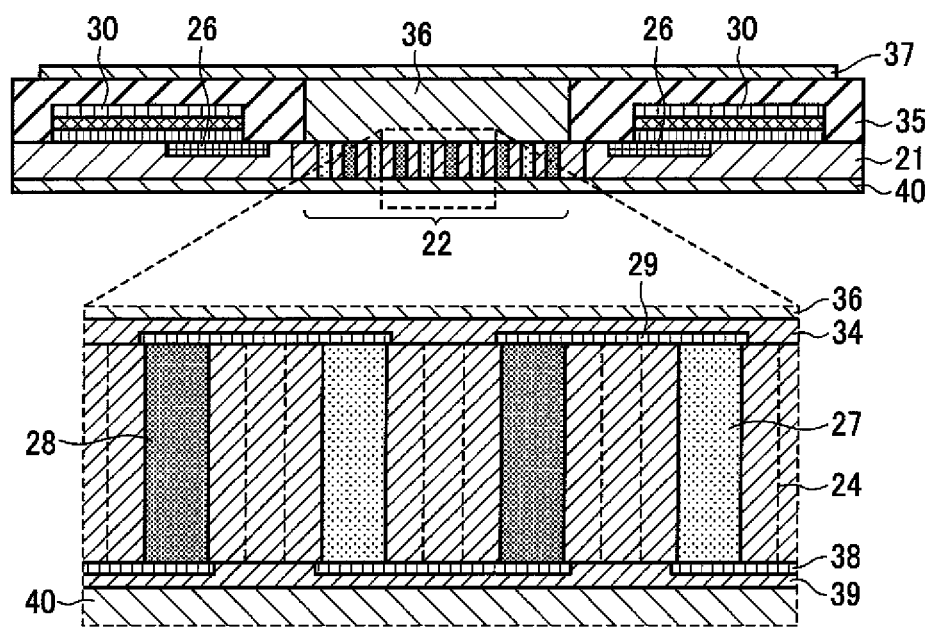

Next, as illustrated in FIG. 4H, the N type thermoelectric bodies 27 and the P type thermoelectric bodies 28 exposed from the rear surface are connected through connection wires 38 made of Cu, and then an insulating film 39 is formed of alumina in accordance with a spattering method. Subsequently, a Cu plating film is formed in accordance with an electroless Cu plating method so as to coat the entirety of the rear surface and a thin Ti film is formed on the surface thereof in accordance with a spattering method, and thus a rear heat incoming/outgoing radiator 40 is formed.

After that, though not shown, the silicon wafer 21 is cut into individual pieces having a size of 2 mm×2 mm, which are then coated with a silicone based biocompatible resin, and thus an electronic thermoelectric power generation device that becomes a thermoelectric power generating wireless temperature sensor to be embedded into an organism is completed. The thus fabricated thermoelectric power generating wireless temperature sensor can wirelessly transmit temperature approximately once every 20 hours when there is a difference of 1° C. in temperature between the front and rear surfaces.

In Example 1 of the present invention, thermally oxidized $SiO_2$ of which the thermal conductivity is 1/100 or less of that Si is used as a reinforcement layer and a thermoelectric conversion element is embedded in a silicon chip, and therefore an electronic device that does not require a change of batteries can be implemented.

Incidentally, a thermoelectric power generating wireless temperature sensor which has the same structure as in Example 1 and which is fabricated by directly embedding a thermoelectric conversion element into a silicon substrate without the formation of thermally oxidized $SiO_2$ has a thermal resistance that is approximately 10 times higher than that in Example 1 and thus has a thermal power output that is 1/100 or lower, which makes wireless transmission totally impossible.

EXAMPLE 2

Figure 5:
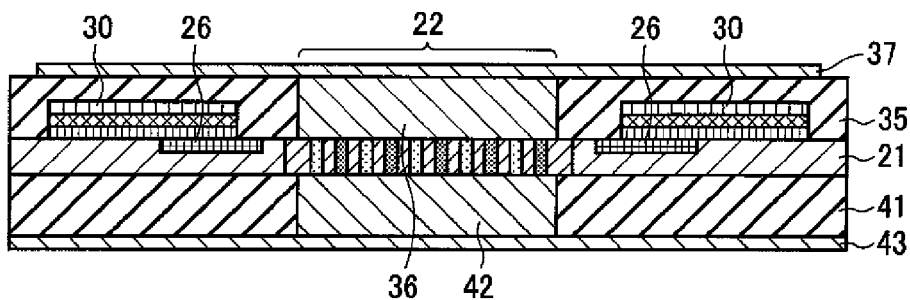
FIG. 5 is a schematic cross-sectional diagram illustrating the electronic thermoelectric power generation device according to Example 2 of the present invention.

Next, the electronic thermoelectric power generation device according to Example 2 of the present invention is described in reference to FIG. 5. The basic structure thereof is the same as in Example 1 except that a heat insulator 41 is provided on the rear surface side, and therefore only the final structure is described in reference to the cross-sectional diagram.

FIG. 5 is a schematic cross-sectional diagram illustrating the electronic thermoelectric power generation device according to Example 2 of the present invention. The rear surface of the silicon wafer 21 is polished so that the thickness is reduced and after that connection wires and an insulating film made of alumina are provided on the rear surface of which the entirety is then coated with a foamed polyolefine-based heat insulating resin having a thickness of about 0.5 mm. Next, a recess is provided through laser drilling so as to expose the major portion of the region 22 in which a thermoelectric conversion element is to be formed, where the remaining portion is the heat insulator 41. Subsequently, the recess is filled in with a heat conductor 42 that is formed in accordance with an electroless Cu plating method. Next, a Cu plating film is formed so as to coat approximately the entire surface and a thin Ti film is formed on the surface thereof in accordance with a spattering method so as to provide a rear heat incoming/outgoing radiator 43.

In Example 2 of the present invention the heat insulator 41 is provided on the rear surface side as well, and therefore the effects of the heat source on the semiconductor circuit 21 are reduced, and thus deterioration due to heat and malfunctioning can be prevented.

EXAMPLE 3

Figure 6:
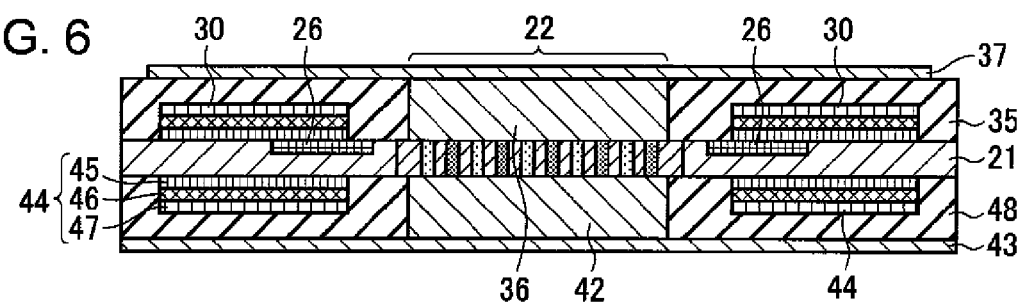
FIG. 6 is a schematic cross-sectional diagram illustrating the electronic thermoelectric power generation device according to Example 3 of the present invention.

Next, the electronic thermoelectric power generation device according to Example 3 of the present invention is described in reference to FIG. 6. The basic structure thereof is the same as in Example 2 except that an all-solid-state Li ion battery 44 is provided on the rear surface side, and therefore only the final structure is described in reference to the cross-sectional diagram.

FIG. 6 is a schematic cross-sectional diagram illustrating the electronic thermoelectric power generation device according to Example 3 of the present invention. The rear surface of the silicon wafer 21 is polished so that the thickness is reduced and after that connection wires and an all-solid-state Li ion battery 44 made of a cathode 45, a solid electrolyte 46 and an anode 47 that are layered on top of each other are provided on the rear surface. Then, the entire surface is coated with a foamed polyolefine-based heat insulating resin having a thickness of approximately 0.5 mm. Subsequently, a recess is provided through laser drilling so as to expose the major portion of the region 22 in which a thermoelectric conversion element is to be formed, where the remaining portion is a heat insulator 48.

Next, the recess is filled in with a heat conductor 42 that is formed in accordance with an electroless Cu plating method. Next, a Cu plating film is formed so as to coat approximately the entire surface and a thin Ti film is formed on the surface thereof in accordance with a spattering method so as to provide a rear heat incoming/outgoing radiator 43.

In Example 3 of the present invention, the all-solid-state Li ion battery 44 is provided on the rear surface side as well and therefore the amount of power storage can be increased approximately twofold. In addition, the all-solid-state Li ion battery 44 is coated with the heat insulator 48 and therefore the effects of the heat source on the semiconductor circuit 26 are reduced, and thus deterioration due to heat and malfunctioning can be prevented.

EXAMPLE 4

Figure 7:
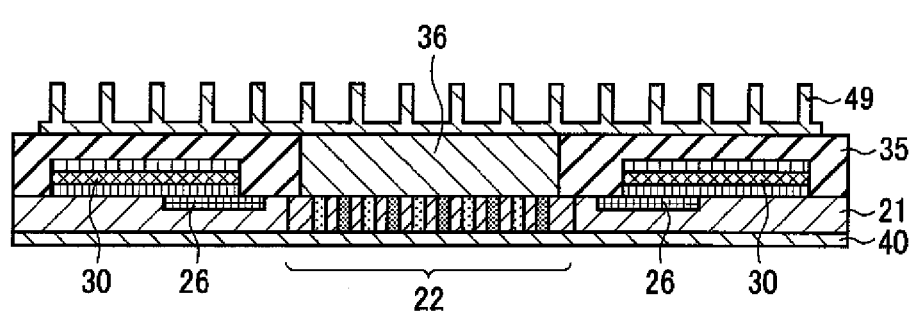
FIG. 7 is a schematic cross-sectional diagram illustrating the electronic thermoelectric power generation device according to Example 4 of the present invention.

Next, the electronic thermoelectric power generation device according to Example 4 of the present invention is described in reference to FIG. 7. The basic structure thereof is the same as in Example 1 except that a heat radiator with heat radiating fins is provided by attaching heat radiating fins to the heat incoming/outgoing radiator on the front surface side, and therefore only the final structure is described in reference to the cross-sectional diagram.

FIG. 7 is a schematic cross-sectional diagram illustrating the electronic thermoelectric power generation device according to Example 4 of the present invention. After the formation of a rear heat incoming/outgoing radiator 40, a patterned resist is formed on the surface of the heat incoming/outgoing radiator on the front surface side, which is followed by selective Cu plating so that heat-releasing fins are formed so as to provide a heat radiator with heat-releasing fins 49.

In Example 4 of the present invention, heat-releasing fins are attached to the heat incoming/outgoing radiator on the front surface side so as to provide a heat radiator with heat-releasing fins, and therefore the difference in temperature between the front and the rear can be increased and accordingly the output of thermoelectric power generation can be made greater.

EXAMPLE 5

Figure 8:
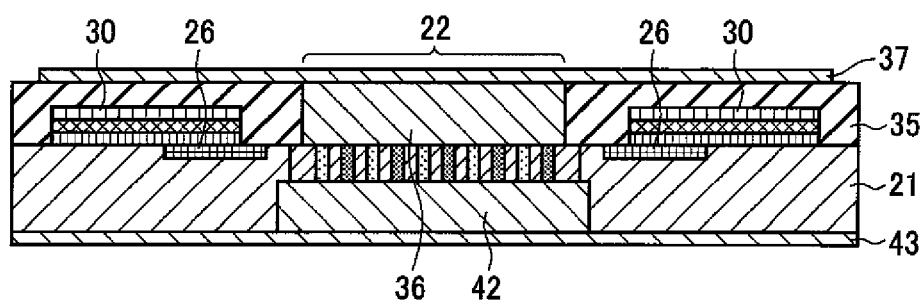
FIG. 8 is a schematic cross-sectional diagram illustrating the electronic thermoelectric power generation device according to Example 5 of the present invention.

Next, the electronic thermoelectric power generation device according to Example 5 of the present invention is described in reference to FIG. 8. The basic structure thereof is the same as in Example 1 except that the rear surface of the thermoelectric conversion element is selectively exposed through etching without polishing the rear surface, and therefore only the final structure is described in reference to the cross-sectional diagram.

FIG. 8 is a schematic cross-sectional diagram illustrating the electronic thermoelectric power generation device according to Example 5 of the present invention. The rear surface of the thermoelectric conversion element is exposed through plasma etching without polishing the rear surface and after that connection wires are formed. Subsequently, an insulating film made of alumina is formed, and then the recess is filled in with a heat conductor 42 that is formed in accordance with an electroless Cu plating method. Next, a Cu plating film is formed so as to coat approximately the entire surface and a thin Ti film is formed on the surface thereof in accordance with a spattering method so as to provide a rear heat incoming/outgoing radiator 43.

In Example 5 of the present invention, the portion where the semiconductor circuit 26 is provided is thick, which increases the mechanical strength and can prevent breakage. In addition, the distance between the semiconductor circuit and the heat source is great and therefore the effects from heat can be reduced.

EXAMPLE 6

Figure 9:
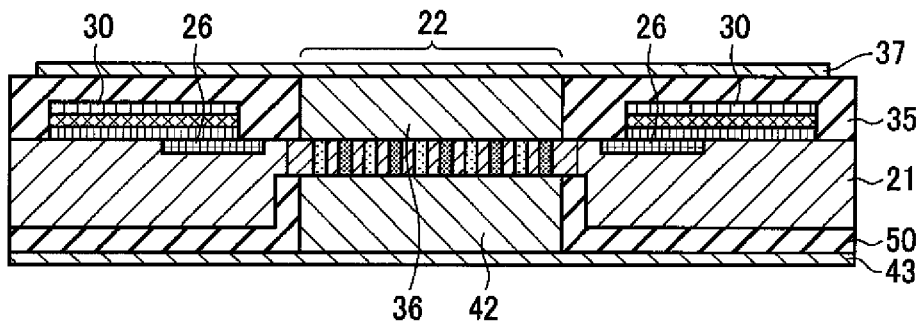
FIG. 9 is a schematic cross-sectional diagram illustrating the electronic thermoelectric power generation device according to Example 6 of the present invention.

Next, the electronic thermoelectric power generation device according to Example 6 of the present invention is described in reference to FIG. 9. The structure thereof is the same as in Example 5 except that the rear surface of the thermoelectric conversion element is exposed through etching without polishing the rear surface, and at the same time the film thick portion is coated with an heat insulator 50, and therefore only the final structure is described in reference to the cross-sectional diagram.

FIG. 9 is a schematic cross-sectional diagram illustrating the electronic thermoelectric power generation device according to Example 6 of the present invention. The rear surface of the thermoelectric conversion element is exposed through plasma etching without polishing the rear surface and after that connection wires are formed. Subsequently, an insulating film made of alumina is formed, and then, the entire surface is coated with a foamed polyolefine-based heat insulating resin, and a recess is provided through laser drilling so as to expose the major portion of the region 22 in which a thermoelectric conversion element is to be formed, where the remaining portion is the heat insulator 50. Next, the recess is filled in with a heat conductor 42 that is formed in accordance with an electroless Cu plating method. Next, a Cu plating film is formed so as to coat approximately the entire surface and a thin Ti film is formed on the surface thereof in accordance with a spattering method so as to provide a rear heat incoming/outgoing radiator 43.

In Example 6 of the present invention, the portion where the semiconductor circuit 26 is provided is thick, which increases the mechanical strength and can prevent breakage. In addition, the distance between the semiconductor circuit and the heat source is great and the coating with the heat insulator 50 is provided, and therefore the effects from heat can further effectively be reduced.

EXAMPLE 7

Figure 10A:
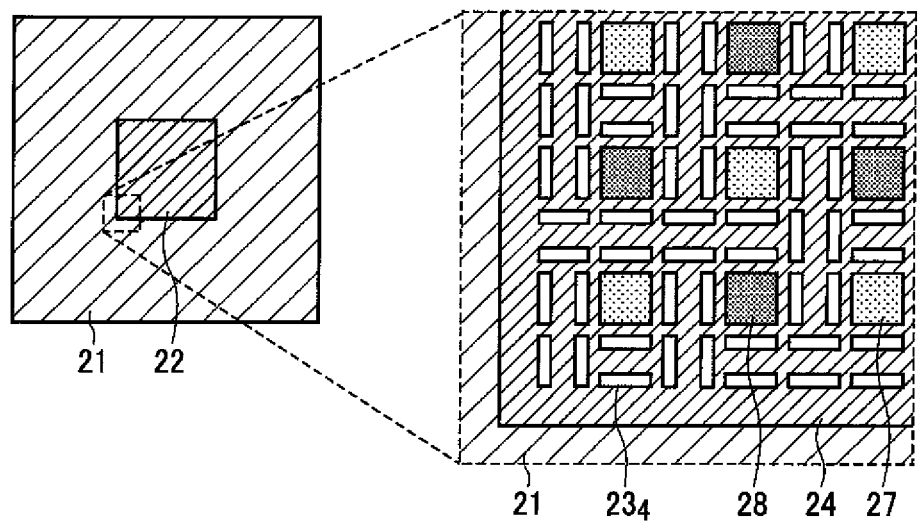
FIGS. 10A and 10B are diagrams illustrating the electronic thermoelectric power generation device according to Example 7 of the present invention.
Figure 10B:
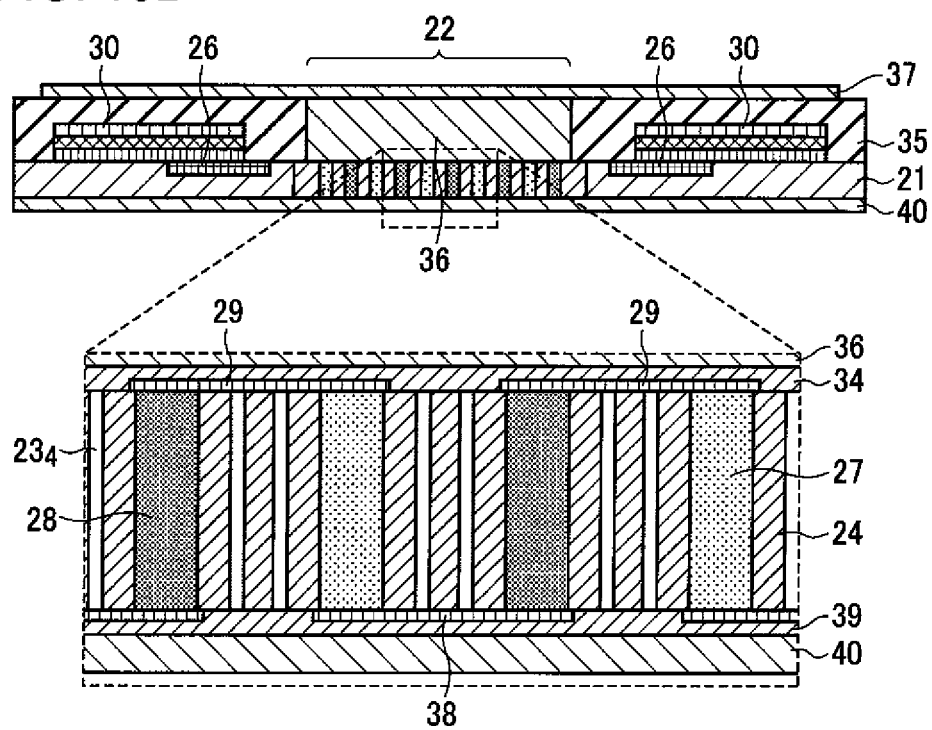

Next, the electronic thermoelectric power generation device according to Example 7 of the present invention is described in reference to FIGS. 10A to 11H. The structure thereof is the same as in Example 1, except that slits (gaps in slit form) are provided in the oxide wall in Example 1. FIGS. 10A and 10E3 are diagrams illustrating the electronic thermoelectric power generation device according to Example 7 of the present invention. FIG. 10A is a schematic plan diagram and FIG. 10B is a schematic cross-sectional diagram. As illustrated in the figures, a region 22 of 1 mm×1 mm in which a thermoelectric conversion element is to be formed is provided in the center portion of a silicon wafer 21, and an all-solid-state Li ion battery 30 is provided so as to surround the region 22 in which a thermoelectric conversion element is to be formed.

The region 22 in which a thermoelectric conversion element is to be formed is provided with N type thermoelectric bodies 27 and P type thermoelectric bodies 28 that are aligned alternately in a two-dimensional matrix form and with an oxide wall 24 in which they are embedded, where slits $23_4$ are provided in the oxide wall 24. In addition, the N type thermoelectric bodies 27 and the P type thermoelectric bodies 28 are connected in series through connection wires 29 and connection wires 38 that are on the upper and lower exposed surfaces, respectively, so as to form a thermoelectric conversion element.

A heat incoming/outgoing radiator 37 is provided on the front surface side of the thermoelectric conversion element with a heat conductor 36 in between, and a rear heat incoming/outgoing radiator 40 is provided on the rear surface side. Here, an insulating film 34 is provided between the heat conductor 36 and the thermoelectric conversion element, and also an insulating film 39 is provided between the thermoelectric conversion element and the rear heat incoming/outgoing radiator 40.

Figure 11A:
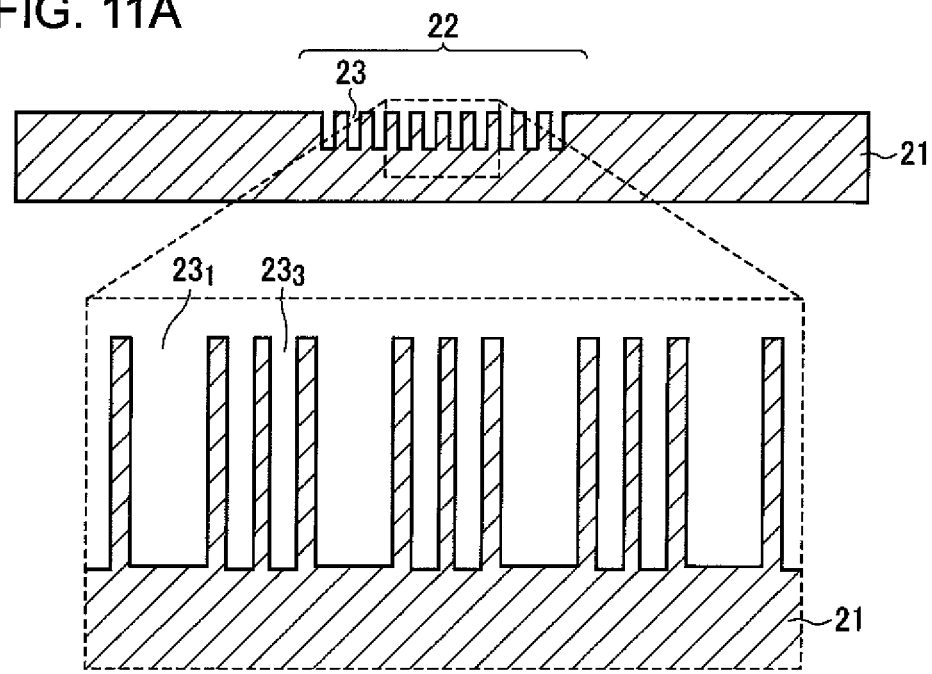
FIGS. 11A and 11B are diagrams for illustrating a step in the middle of the manufacturing process for the electronic thermoelectric power generation device according to Example 7 of the present invention.

Next, the process for manufacturing an electronic thermoelectric power generation device according to Example 7 of the present invention is described in reference to FIGS. 11A to 11H. First, as illustrated in FIG. 11A, a region of 1 mm×1 mm in the center portion of a silicon wafer 21 is defined as a region 22 in which a thermoelectric conversion element is to be formed, where slits are created in accordance with a Si deep RIE method. As illustrated in the enlarged diagram, these slits 23 include recesses $23_1$ to be filled in, which have a width of 10 μm and a depth of 30 μm, and slits $23_3$ for the formation of thermally oxidized SiO$_2$, which have a width of 2 μm and a depth of 30 μm.

Figure 11B:
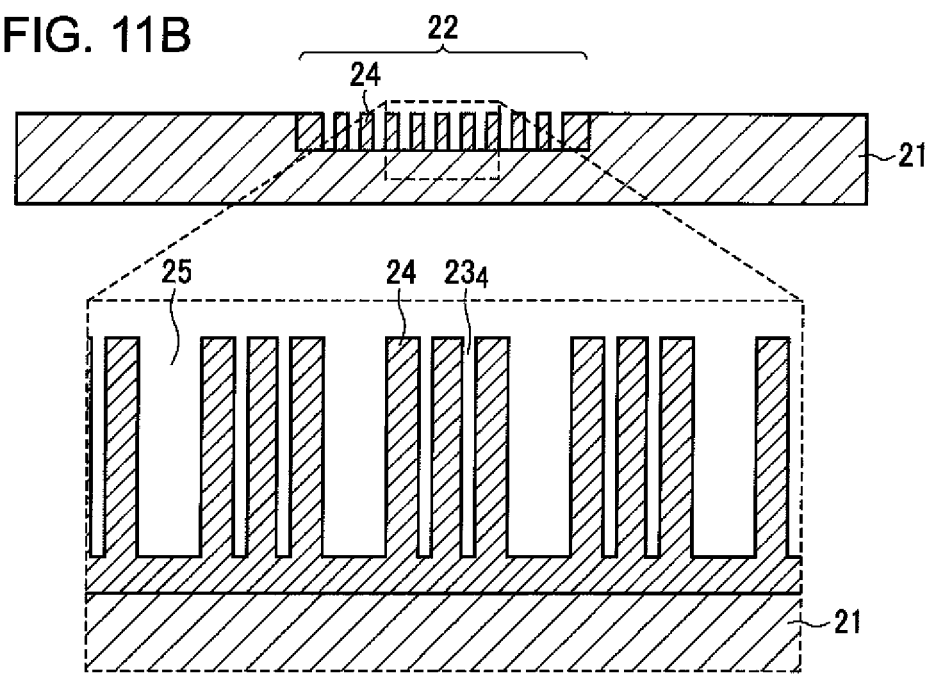

Next, as illustrated in FIG. 11B, thermal oxidation is carried out in a high temperature wet atmosphere at 1100° C. so that Si in the region 22 in which a thermoelectric conversion element is to be formed and slits 23 have been created is completely converted to thermally oxidized SiO$_2$, forming an oxide wall 24. At this time, the recesses $23_1$ to be filled in are converted to recesses 25 to be filled in, of which the width is narrower by approximately 1 μm, and the slits $23_2$ are converted to slits $23_4$ having a width of approximately 1 μm.

Figure 11C:
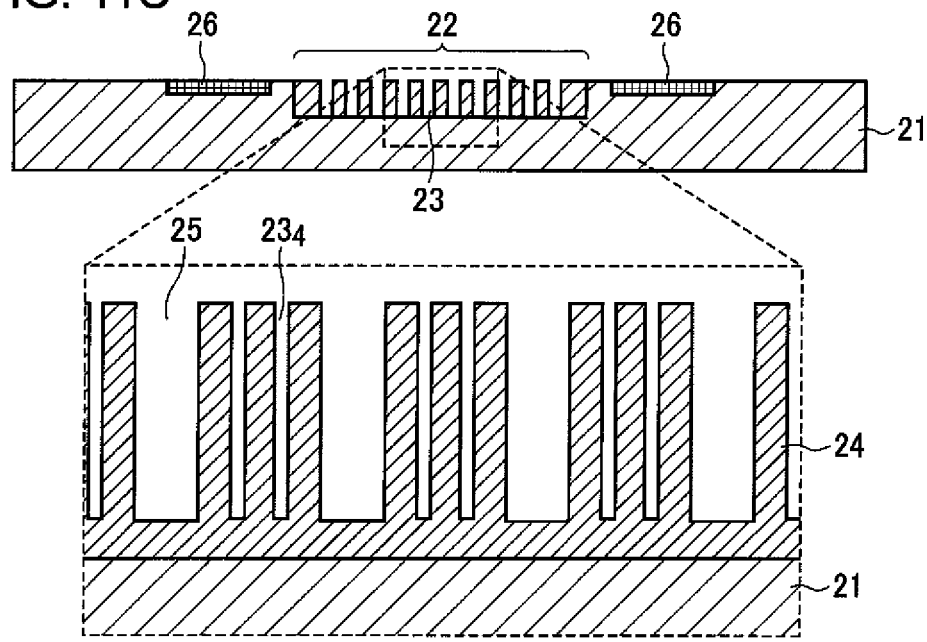
FIGS. 11C and 11D are diagrams for illustrating a step after the step in FIG. 11B of the manufacturing process for the electronic thermoelectric power generation device according to Example 7 of the present invention.

Next, as illustrated in FIG. 11C, a semiconductor circuit 26 that includes a temperature sensor, a low-power wireless circuit, a signal processing circuit, a boosting circuit, a charging and discharging circuit and the like is formed on the silicon wafer 21 in accordance with a conventional semiconductor process.

Figure 11D:
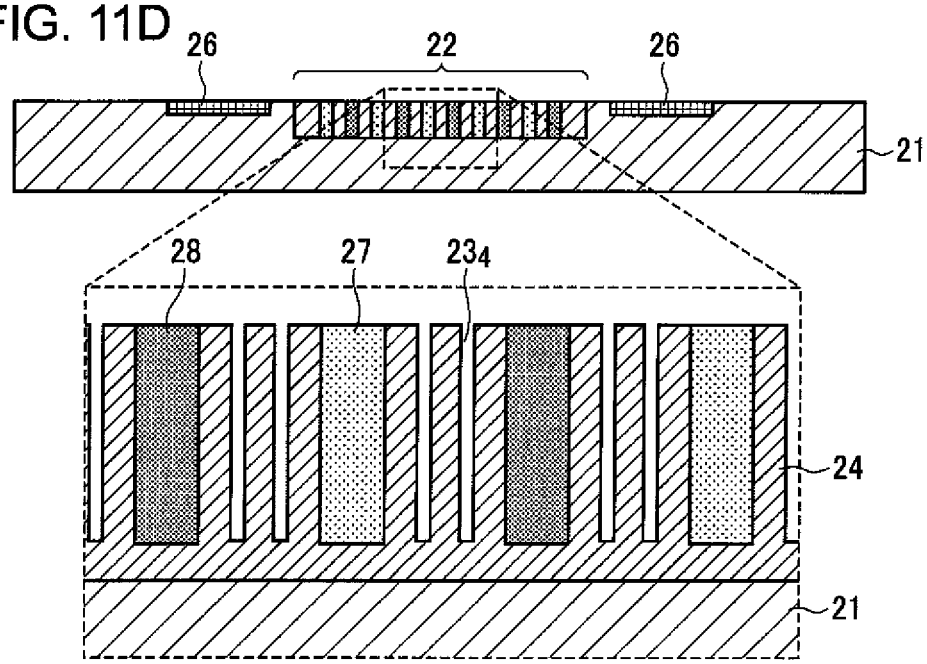

Next, as illustrated in FIG. 11D, the recesses 25 to be filled in are alternatively filled in with particles of a P type thermoelectric conversion material (Bi$_{0.3}$Sb$_{1.7}$Te$_3$) and an N type thermoelectric conversion material (Bi$_2$Te$_3$), using a metal mask in accordance with an aerosol deposition method. Next, annealing is carried out at 450° C. so as to form N type thermoelectric bodies 27 and P type thermoelectric bodies 28 in rod form.

Figure 11E:
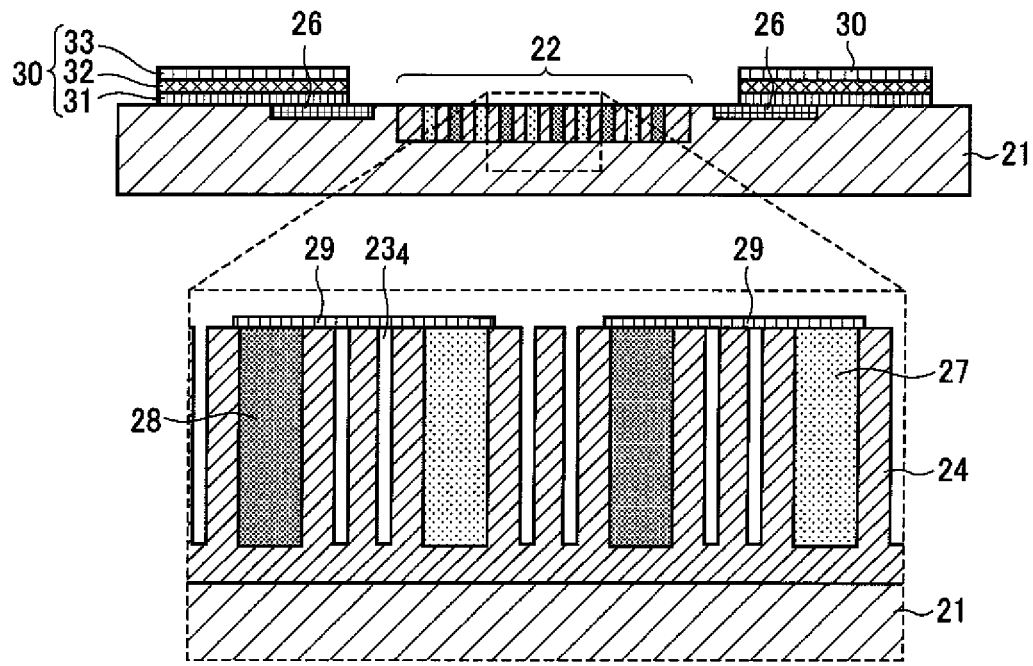
FIGS. 11E and 11F are diagrams for illustrating a step after the step in FIG. 11D of the manufacturing process for the electronic thermoelectric power generation device according to Example 7 of the present invention.

Next, as illustrated in FIG. 11E, connection wires 29 are formed of Cu in order to connect the N type thermoelectric bodies 27 and the P type thermoelectric bodies 28. Next, an all-solid-state Li ion battery 30 having a size of 1.8 mm×1.8 mm is formed outside the region 22 of 1 mm×1 mm in which a thermoelectric conversion element is to be formed. The all-solid-state Li ion battery 30 is formed of a cathode 31 made of LiCo$_2$, a solid electrolyte 32 made of LiPON and an anode 33 made of Li through spattering in this order. Though not shown, current collectors are formed of Pt so as to be connected to the cathode 31 and the anode 33, respectively.

Figure 11F:
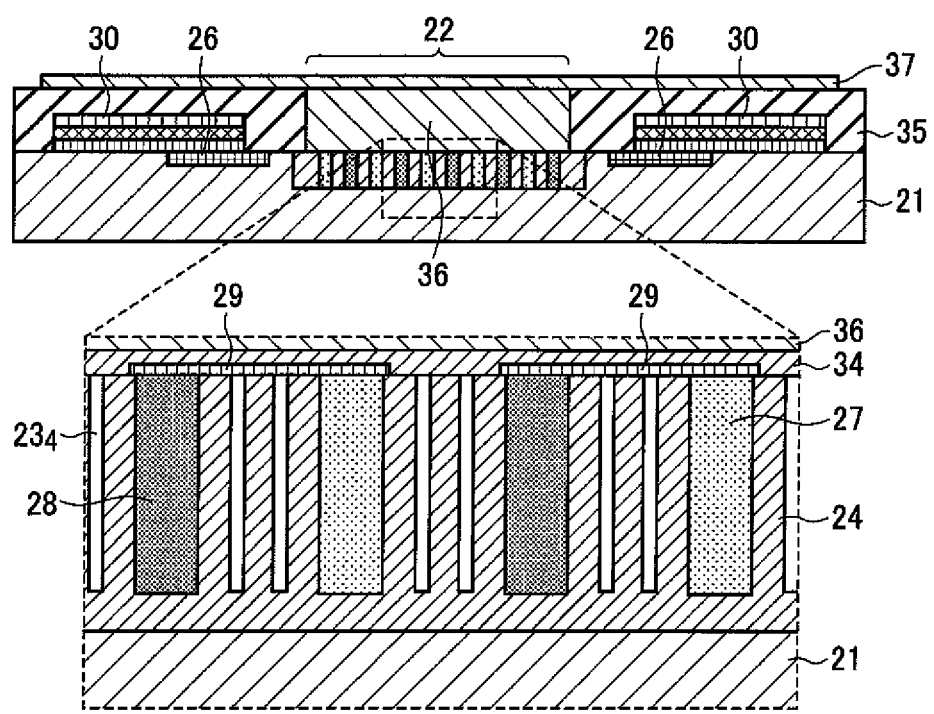

Next, as illustrated in FIG. 11F, an insulating film 34 is formed of alumina in accordance with a spattering method. Next, the surface is coated with a foamed polyolefine-based heat insulating resin having a thickness of about 0.5 mm, and after that, a recess is created through laser drilling so as to expose the major portion of the region 22 in which a thermoelectric conversion element is to be formed, where the remaining portion is a heat insulator 35. Next, a heat conductor 36 with which the recess is filled in is formed in accordance with an electroless Cu plating method. Next, a Cu plating film that coats approximately the entire surface is formed and a thin Ti film is formed on the surface in accordance with a spattering method so as to provide a heat incoming/outgoing radiator 37.

Figure 11G:
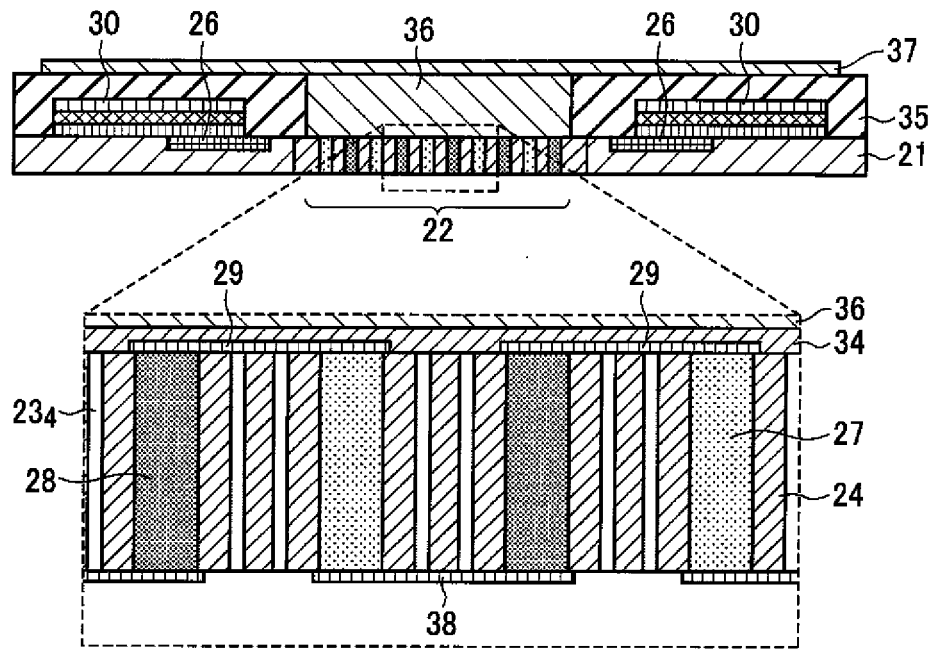
FIGS. 11G and 11H are diagrams for illustrating a step after the step in FIG. 11F of the manufacturing process for the electronic thermoelectric power generation device according to Example 7 of the present invention.

Next, as illustrated in FIG. 11G, the rear surface of the silicon wafer 21 is polished according to a mechanical polishing method so that the thickness is reduced to 30 μm and the N type thermoelectric bodies 27 and the P type thermoelectric bodies 28 are exposed from the rear surface.

Figure 11H:
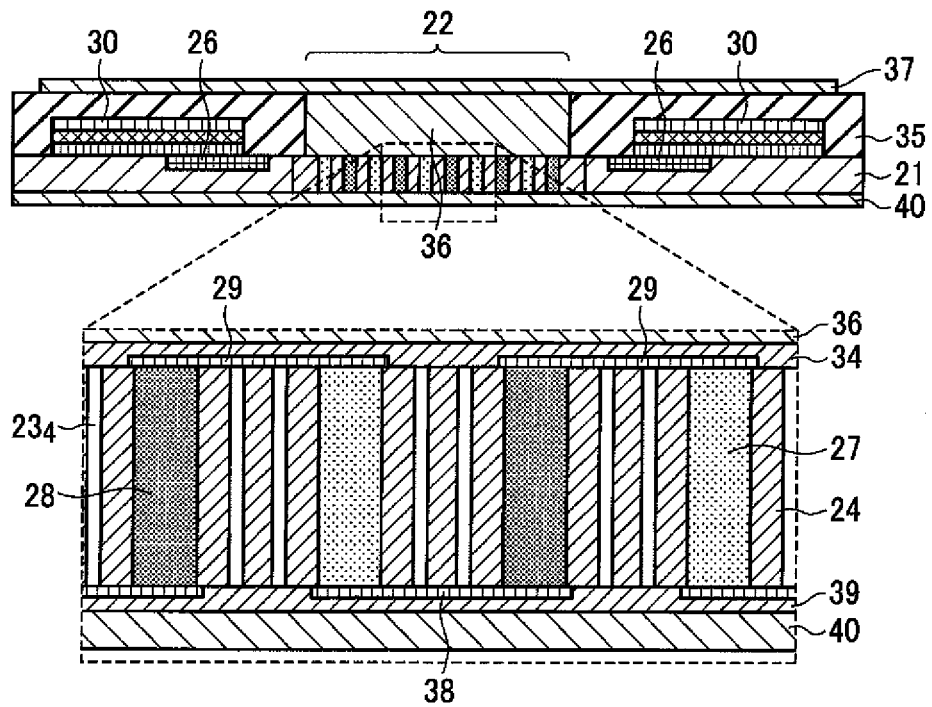

Next, as illustrated in FIG. 11H, the N type thermoelectric bodies 27 and the P type thermoelectric bodies 28 exposed from the rear surface are connected through connection wires 38 made of Cu, and then an insulating film 39 is formed of alumina in accordance with a spattering method. Subsequently, a Cu plating film is formed in accordance with an electroless Cu plating method so as to coat the entirety of the rear surface and a thin Ti film is formed on the surface thereof in accordance with a spattering method, and thus a rear heat incoming/outgoing radiator 40 is formed.

After that, though not shown, the silicon wafer 21 is cut into individual pieces having a size of 2 mm×2 mm, which are then coated with a silicone based biocompatible resin, and thus an electronic thermoelectric power generation device that becomes a thermoelectric power generating wireless temperature sensor to be embedded into an organism is completed. The thus fabricated thermoelectric power generating wireless temperature sensor can wirelessly transmit temperature approximately once every 12 hours when there is a difference of 1° C. in temperature between the front and rear surfaces.

In Example 7 of the present invention, slits $23_4$ are provided in the oxide wall 24 that becomes an reinforcement layer, and therefore the thermal resistance of the reinforcement layer further increases and the output of thermoelectric power generation can further be made greater. In Example 7 as well, the structure in any of FIGS. 5 to 9 may be adopted.

EXAMPLE 8

Figure 12A:
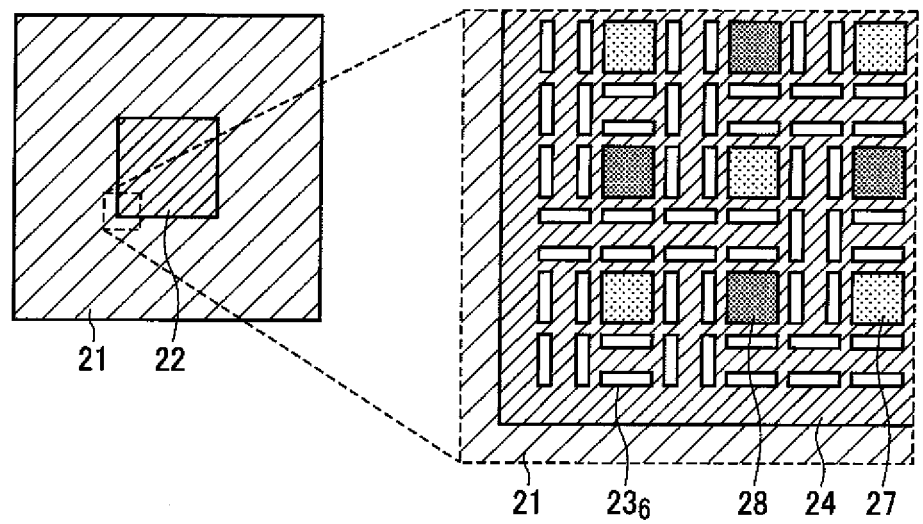
FIGS. 12A and 12B are diagrams illustrating the electronic thermoelectric power generation device according to Example 8 of the present invention.
Figure 12B:
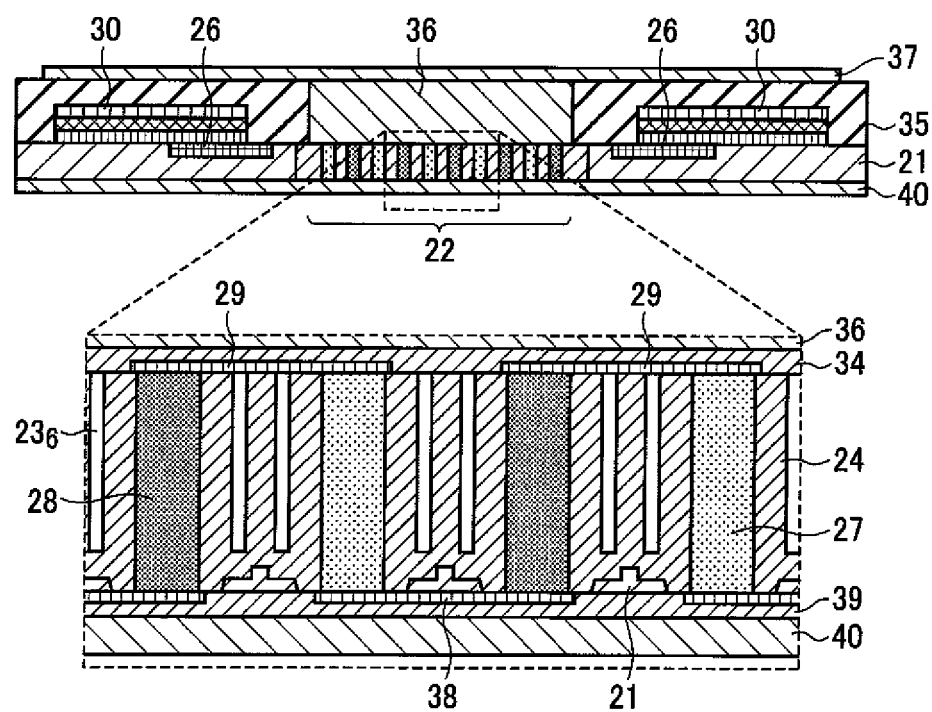

Next, the electronic thermoelectric power generation device according to Example 8 of the present invention is described in reference to FIGS. 12A to 13D. The basic process thereof is the same as in Example 1, except that the penetrating rods are taller than those in Example 1. FIGS. 12A and 12B are diagrams illustrating the electronic thermoelectric power generation device according to Example 8 of the present invention. FIG. 12A is a schematic plan diagram and FIG. 12B is a schematic cross-sectional diagram. As illustrated in the figures, a region 22 of 1 mm×1 mm in which a thermoelectric conversion element is to be formed is provided in the center portion of a silicon wafer 21, and an all-solid-state Li ion battery 30 is provided so as to surround the region 22 in which a thermoelectric conversion element is to be formed.

The region 22 in which a thermoelectric conversion element is to be formed is provided with N type thermoelectric bodies 27 and P type thermoelectric bodies 28 that have a height of about 50 μm and are aligned alternately in a two-dimensional matrix form and with an oxide wall 24 in which the thermoelectric bodies are embedded, where slits (gaps) $23_6$ are provided in the oxide wall 24. The portions of the silicon wafer 21 that have been left unoxidized remain at the bottom of the slits $23_6$. In addition, the N type thermoelectric bodies 27 and the P type thermoelectric bodies 28 are connected in series through connection wires 29 and connection wires 38 that are on the upper and lower exposed surfaces, respectively, so as to form a thermoelectric conversion element.

A heat incoming/outgoing radiator 37 is provided on the front surface side of the thermoelectric conversion element with a heat conductor 36 in between, and a rear heat incoming/outgoing radiator 40 is provided on the rear surface side. Here, an insulating film 34 is provided between the heat conductor 36 and the thermoelectric conversion element, and also an insulating film 39 is provided between the thermoelectric conversion element and the rear heat incoming/outgoing radiator 40.

Figure 13C:
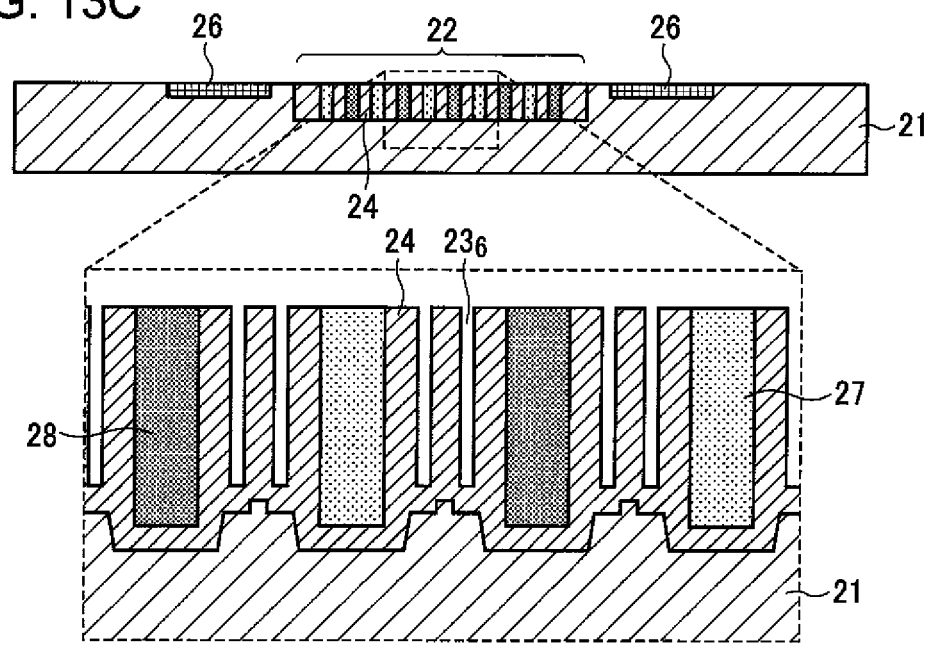
FIGS. 13C and 13D are diagrams for illustrating a step after the step in FIG. 13B of the manufacturing process for the electronic thermoelectric power generation device according to Example 8 of the present invention.

Next, the process for manufacturing an electronic thermoelectric power generation device according to Example 8 of the present invention is described in reference to FIGS. 13A to 13D. First, as illustrated in FIG. 13A, a region of 1 mm×1 mm in the center portion of a silicon wafer 21 is defined as a region 22 in which a thermoelectric conversion element is to be formed, where slits 23 are created in accordance with a Si deep RIE method. As illustrated in the enlarged diagram, these slits 23 include recesses $23_1$ to be filled in, which have a width of 10 μm and a depth of 50 μm, and slits $23_5$ for the formation of thermally oxidized $SiO_2$, which have a width of 2 μm and a depth of 50 μm. Here, the width of the slits $23_5$ is narrow, and therefore the depth thereof does not effectively reach 50 μm.

Next, as illustrated in FIG. 13B, thermal oxidation is carried out in a high temperature wet atmosphere at 1100° C. so that Si in the region 22 in which a thermoelectric conversion element is to be formed and slits 23 have been created is converted to thermally oxidized $SiO_2$. At this time, the recesses $23_1$ to be filled in are converted to recesses 25 to be filled in, of which the width is narrower by approximately 1 μm, and the slits $23_2$ are converted to slits $23_6$ having a width of approximately 1 μm. In slits $23_6$, oxidation progresses slower, and therefore unoxidized portions of silicon wafer 21 remain at the bottom of the slits $23_6$.

Next, as illustrated in FIG. 13C, a semiconductor circuit 26 that includes a temperature sensor, a low-power wireless circuit, a signal processing circuit, a boosting circuit, a charging and discharging circuit and the like is formed on the silicon wafer 21 in accordance with a conventional semiconductor process. Next, the recesses 25 to be filled in are alternatively filled in with particles of a P type thermoelectric conversion material ($Bi_{0.3}Sb_{1.7}Te_3$) and an N type thermoelectric conversion material ($Bi_2Te_3$), using a metal mask in accordance with an aerosol deposition method. Next, annealing is carried out at 450° C. so as to form N type thermoelectric bodies 27 and P type thermoelectric bodies 28 in rod form.

Figure 13D:
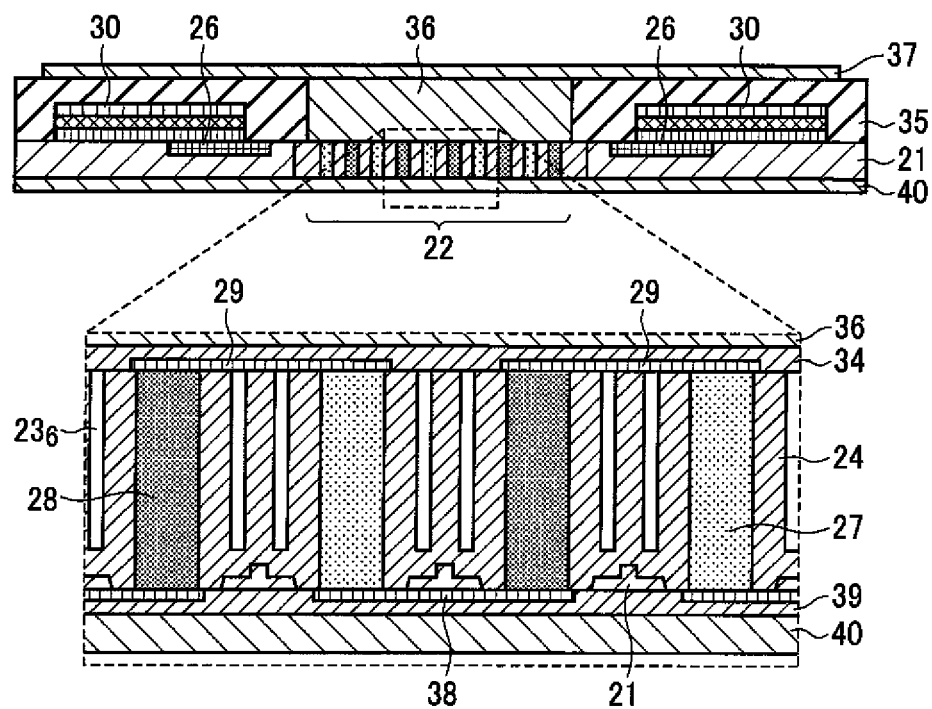

After that, as illustrated in FIG. 13D, connection wires 29 are formed of Cu in order to connect the N type thermoelectric bodies 27 and the P type thermoelectric bodies 28 in the same manner as in Example 1. In addition, an all-solid-state Li ion battery 30 having a size of 1.8 mm×1.8 mm is formed outside the region 22 of 1 mm×1 mm in which a thermoelectric conversion element is to be formed. The all-solid-state Li ion battery 30 is formed of a cathode 31 made of $LiCoO_2$, a solid electrolyte 32 made of LiPON and an anode 33 made of Li through spattering in this order. Though not shown, current collectors are formed of Pt on the cathode 31 and the anode 33, respectively.

Next, an insulating film 34 is formed of alumina in accordance with a spattering method. Subsequently, the surface is coated with a foamed polyolefine-based heat insulating resin having a thickness of about 0.5 mm, and after that a recess is created through laser drilling so as to expose the major portion of the region 22 in which a thermoelectric conversion element is to be formed, where the remaining portion is a heat insulator 35. Next, a heat conductor 36 with which the recess is filled in is formed in accordance with an electroless Cu plating method. Next, a Cu plating film that coats approximately the entire surface is formed and a thin Ti film is formed on the surface in accordance with a spattering method so as to provide a heat incoming/outgoing radiator 37.

Next, the rear surface of the silicon wafer 21 is polished according to a mechanical polishing method so that the thickness is reduced to 50 μm and the N type thermoelectric bodies 27 and the P type thermoelectric bodies 28 are exposed from the rear surface. Subsequently, the N type thermoelectric bodies 27 and the P type thermoelectric bodies 28 exposed from the rear surface are connected through connection wires 38 made of Cu, and then an insulating film 39 is formed of alumina in accordance with a spattering method. Subsequently, a Cu plating film is formed in accordance with an electroless Cu plating method so as to coat the entirety of the rear surface and a thin Ti film is formed on the surface thereof in accordance with a spattering method, and thus a rear heat incoming/outgoing radiator 40 is formed.

Next, though not shown, the silicon wafer 21 is cut into individual pieces having a size of 2 mm×2 mm, which are then coated with a silicone based biocompatible resin, and thus an electronic thermoelectric power generation device that becomes a thermoelectric power generating wireless temperature sensor to be embedded into an organism is completed.

In Example 8 of the present invention, the N type thermoelectric bodies 27 and the P type thermoelectric bodies 28 that form a thermoelectric conversion element have a higher aspect ratio, and therefore the difference in temperature between the front and the rear of the electronic thermoelectric power generation device can be made greater, which can make the output of thermoelectric power generation greater. In Example 8 as well, the structure in any of FIGS. 5 to 9 may be adopted.

EXAMPLE 9

Figure 14A:
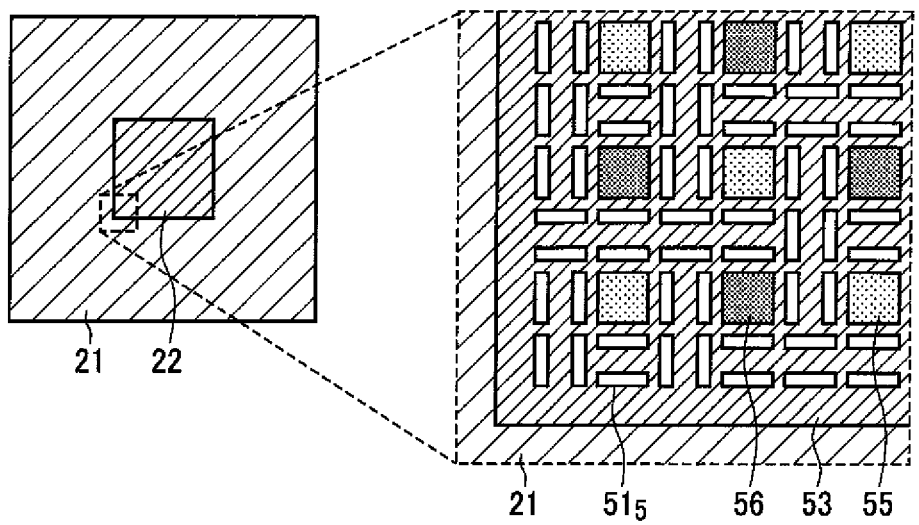
FIGS. 14A and 14B are diagrams illustrating the electronic thermoelectric power generation device according to Example 9 of the present invention.
Figure 14B:
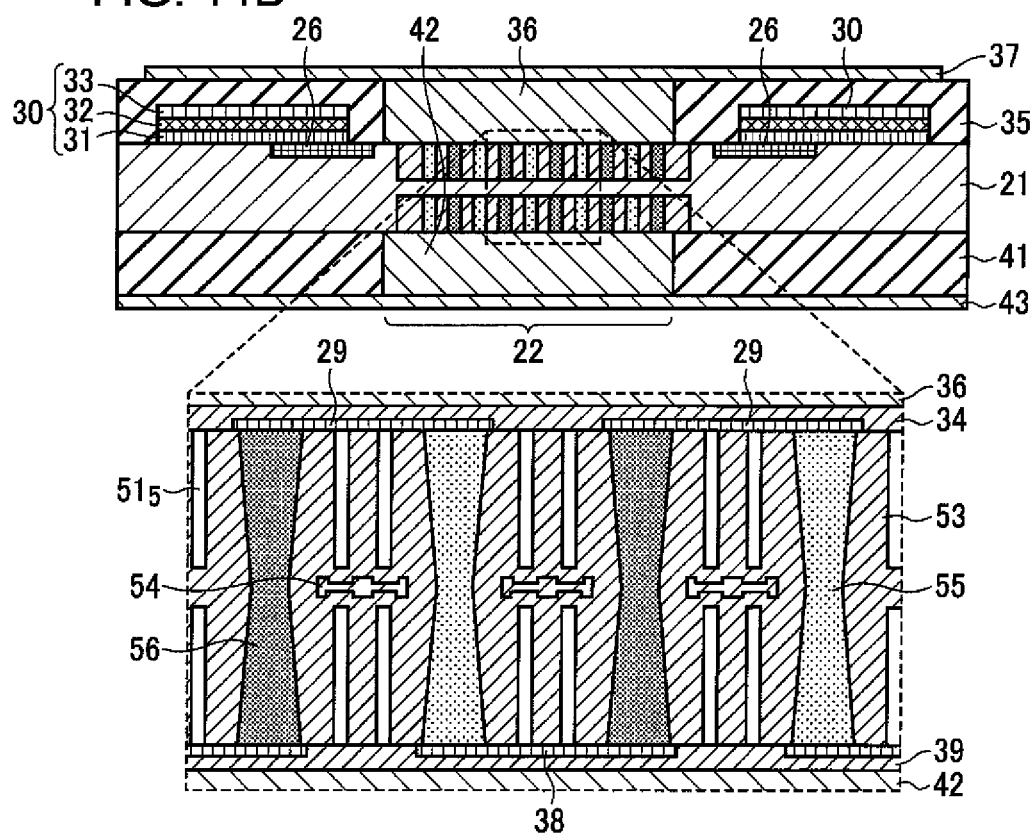

Next, the electronic thermoelectric power generation device according to Example 9 of the present invention is described in reference to FIGS. 14A to 15G. The structure thereof is the same as in Example 1, except that slits are created on both sides, front and rear, of the substrate, making the process of polishing the rear surface unnecessary. FIGS. 14A and 14B are diagrams illustrating the electronic thermoelectric power generation device according to Example 9 of the present invention. FIG. 14A is a schematic plan diagram and FIG. 14B is a schematic cross-sectional diagram. As illustrated in the figures, a region 22 of 1 mm×1 mm in which a thermoelectric conversion element is to be formed is provided in the center portion of a silicon wafer 21, and an all-solid-state Li ion battery 30 is provided so as to surround the region 22 in which a thermoelectric conversion element is to be formed.

The region 22 in which a thermoelectric conversion element is to be formed is provided with N type thermoelectric bodies 55 and P type thermoelectric bodies 56 that are aligned alternately in a two-dimensional matrix form and with an oxide wall 53 in which they are embedded, where slits $51_5$ (gaps) are provided on both sides, front and rear, of the oxide wall 53. Silicon regions 54 are left unoxidized in the middle of the substrate between the front and rear slits. In addition, the N type thermoelectric bodies 27 and the P type thermoelectric bodies 28 are connected in series through connection wires 29 and connection wires 38 that are on the upper and lower exposed surfaces, respectively, so as to form a thermoelectric conversion element.

A heat incoming/outgoing radiator 37 and a rear heat incoming/outgoing radiator 43 are provided on the front and rear surface sides of the thermoelectric conversion element with heat conductors 36 and 42 respectively in between. Here, an insulating film 34 is provided between the heat conductor 36 and the thermoelectric conversion element, and also an insulating film 39 is provided between the thermoelectric conversion element and the heat conductor 42, and furthermore a heat insulator 41 is provided on the rear surface of the silicon wafer 21.

Figure 15A:
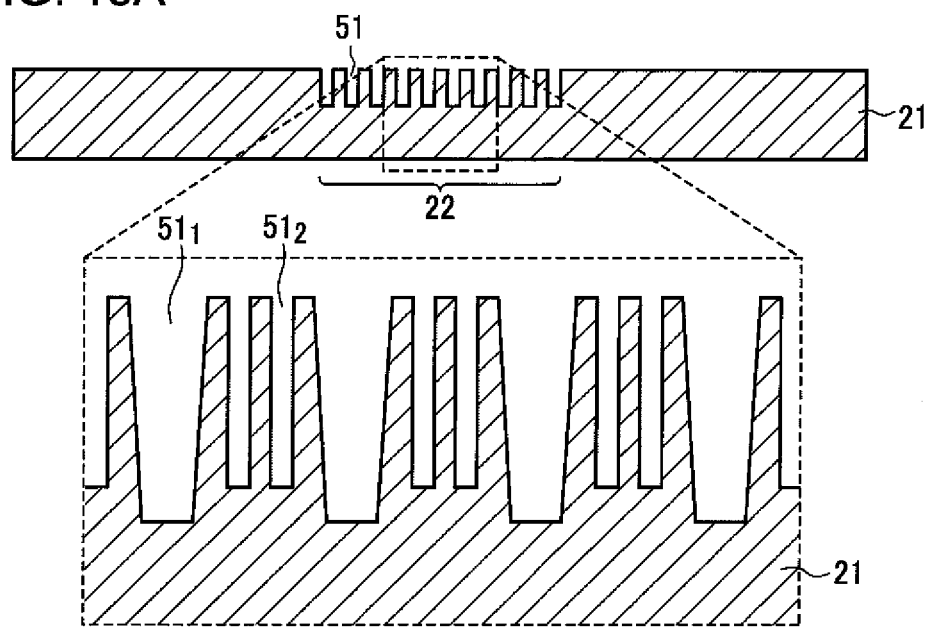
FIGS. 15A and 15B are diagrams for illustrating a step in the middle of the manufacturing process for the electronic thermoelectric power generation device according to Example 9 of the present invention.

Next, the process for manufacturing an electronic thermoelectric power generation device according to Example 9 of the present invention is described in reference to FIGS. 15A to 15G. First, as illustrated in FIG. 15A, a region of 1 mm×1 mm in the center portion of a silicon wafer 21 having a thickness of 100 μm on the front surface side is defined as a region 22 in which a thermoelectric conversion element is to be formed, where slits 51 are created in accordance with a Si deep RIE method. As illustrated in the enlarged diagram, these slits 51 include recesses $51_1$ to be filled in, which have a width of 10 μm and a depth of 50 μm, and slits $51_2$ for the formation of thermally oxidized $SiO_2$, which have a width of 2 μm and a depth of 50 μm. Here, the width of the slits $51_2$ is narrow, and therefore the depth thereof does not effectively reach 50 μm.

Figure 15B:
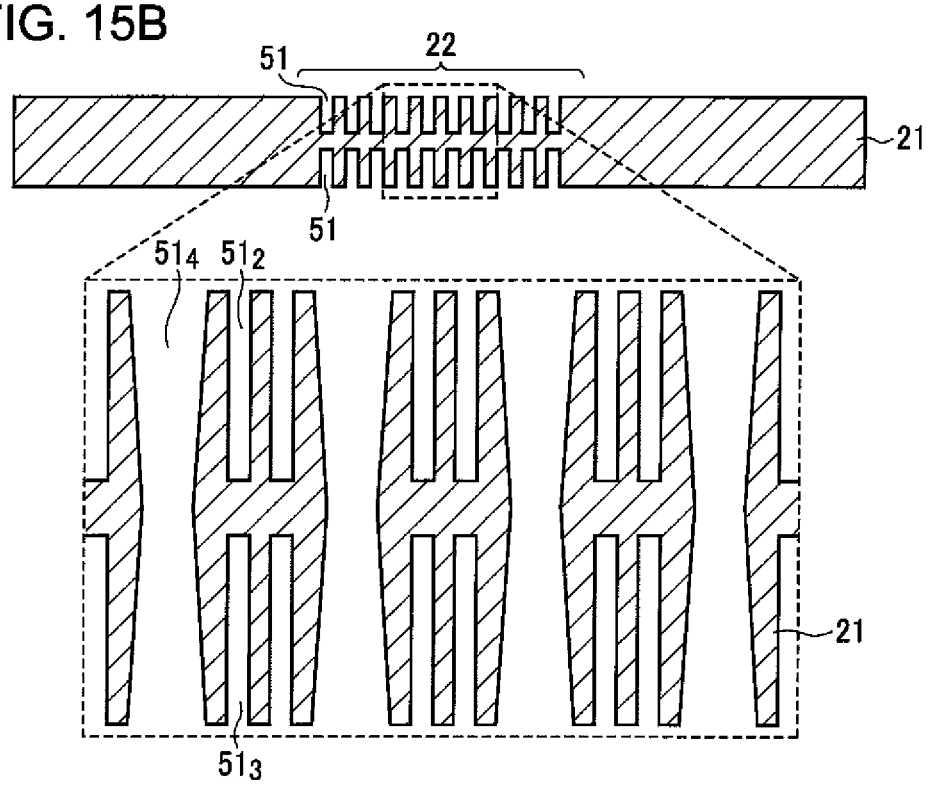

Next, as illustrated in FIG. 15B, the silicon wafer 21 is turned over and a region of 1 mm×1 mm in the center portion of the silicon wafer 21 on the rear surface side is defined as a region 22 in which a thermoelectric conversion element is to be formed, where slits 51 are created in accordance with a Si deep RIE method. As illustrated in the enlarged diagram, these slits 51 also include recesses $51_1$ to be filled in, which have a width of 10 μm and a depth of 50 μm, and slits $51_3$ for the formation of thermally oxidized $SiO_2$, which have a width of 2 μm and a depth of 50 μm. At this time, the positions of the upper and lower slits 51 are matched so that the recesses $51_1$ to be filled in are connected so as to provide through holes $51_4$ to be filled in, which are in the form of a long hourglass-shaped hand drum. Meanwhile the slits $51_2$ and slits $51_3$ are not connected.

Figure 15C:
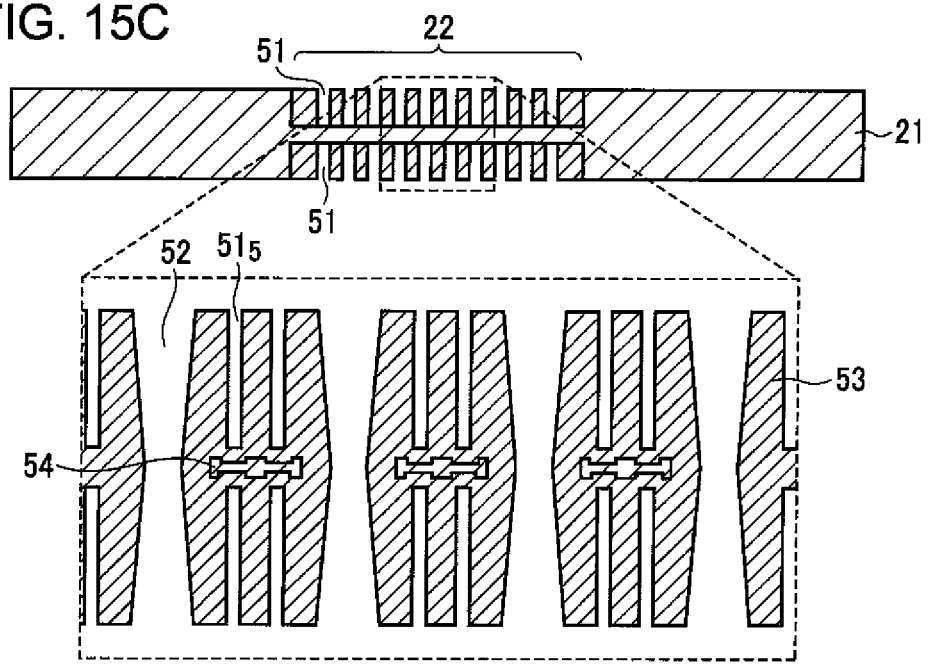
FIGS. 15C and 15D are diagrams for illustrating a step after the step in FIG. 15B of the manufacturing process for the electronic thermoelectric power generation device according to Example 9 of the present invention.

Next, as illustrated in FIG. 15C, thermal oxidation is carried out in a high temperature wet atmosphere at 1100° C. so that Si in the region 22 in which a thermoelectric conversion element is to be formed and slits 51 have been created is converted to thermally oxidized $SiO_2$ so as to form an oxide wall 53. At this time, the through holes $51_4$ to be filled in are converted to through holes 52 to be filled in, of which the width is narrower by approximately 1 μm, and the slits $51_2$ and $51_3$ are converted to slits $51_5$ having a width of approximately 1 μm. Oxidation progresses slower in slits $51_2$ and $51_3$, and therefore silicon regions 54 remain unoxidized in the middle portions of the silicon wafer between the slits $51_5$.

Figure 15D:
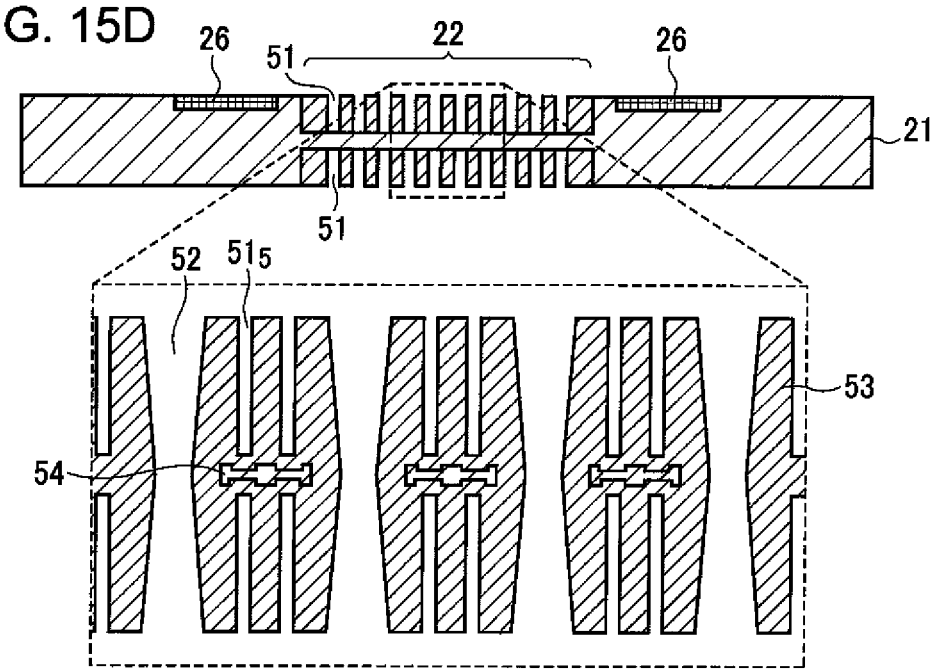

Next, as illustrated in FIG. 15D, a semiconductor circuit 26 that includes a temperature sensor, a low-power wireless circuit, a signal processing circuit, a boosting circuit, a charging and discharging circuit and the like is formed on the silicon wafer 21 in accordance with a conventional semiconductor process.

Figure 15E:
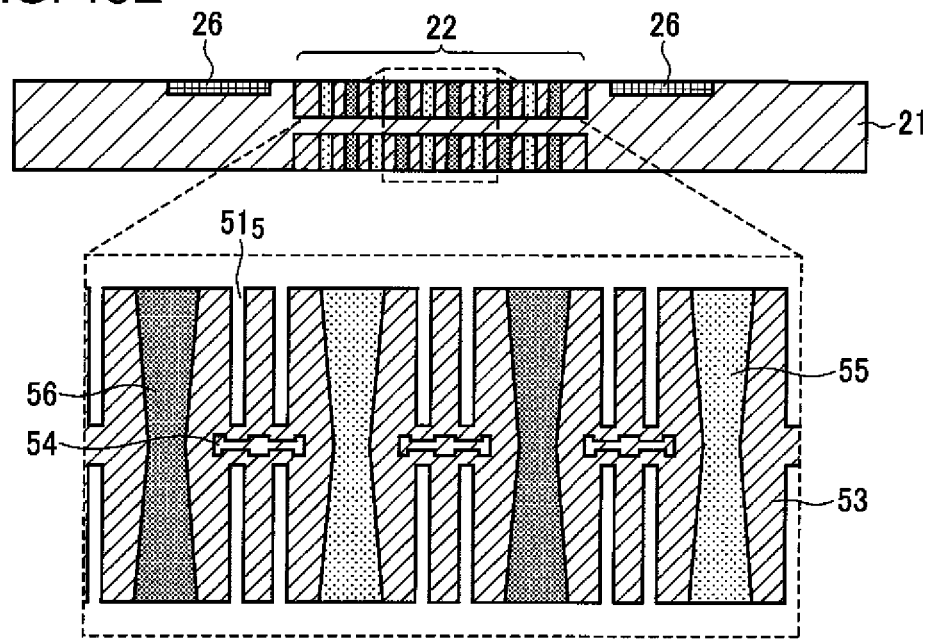
FIGS. 15E and 15F are diagrams for illustrating a step after the step in FIG. 15D of the manufacturing process for the electronic thermoelectric power generation device according to Example 9 of the present invention.

Next, as illustrated in FIG. 15E, the through holes 52 to be filled in are alternatively filled in with particles of a P type thermoelectric conversion material ($Bi_{0.3}Sb_{1.7}Te_3$) and an N type thermoelectric conversion material ($Bi_2Te_3$), using a metal mask in accordance with an aerosol deposition method. Next, annealing is carried out at 450° C. so as to form N type thermoelectric bodies 55 and P type thermoelectric bodies 56 in rod form.

Figure 15F:
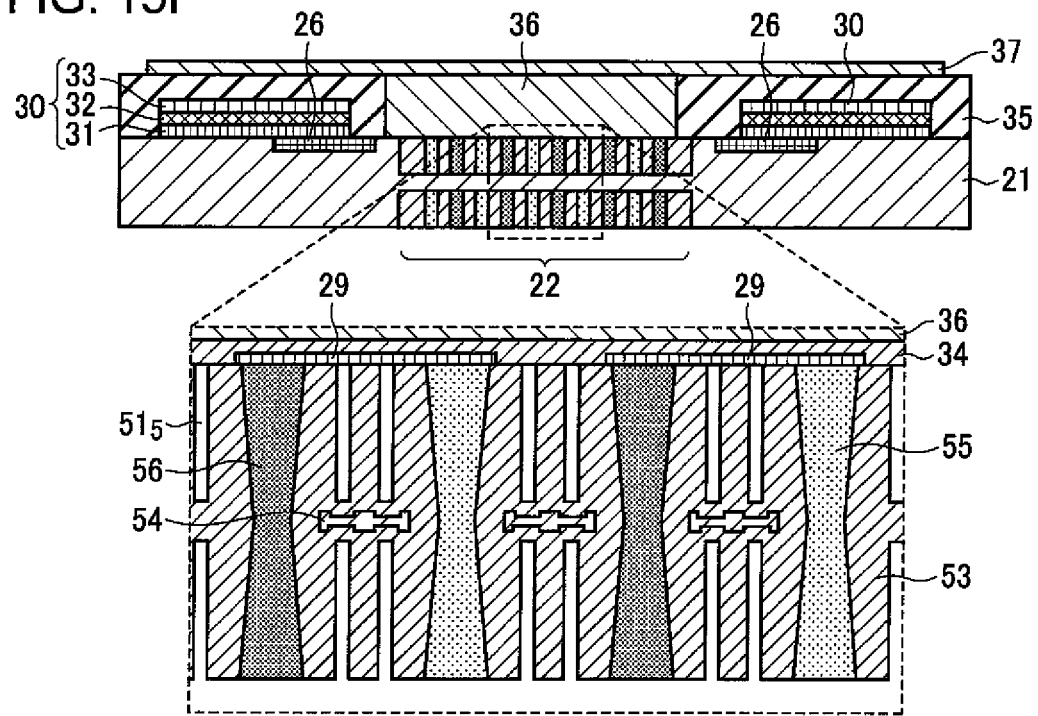

Next, as illustrated in FIG. 15F, connection wires 29 are formed of Cu in order to connect the N type thermoelectric bodies 55 and the P type thermoelectric bodies 56, and furthermore an all-solid-state Li ion battery 30 having a size of 1.8 mm×1.8 mm is formed outside the region 22 of 1 mm×1 mm in which a thermoelectric conversion element is to be formed. The all-solid-state Li ion battery 30 is formed of a cathode 31 made of $LiCo_2$, a solid electrolyte 32 made of LiPON and an anode 33 made of Li through spattering in this order. Though not shown, current collectors are formed of Pt on the cathode 31 and the anode 33, respectively.

Next, an insulating film 34 is formed of alumina in accordance with a spattering method, and subsequently, the surface is coated with a foamed polyolefine-based heat insulating resin having a thickness of about 0.5 mm, and after that a recess is created through laser drilling so as to expose the major portion of the region 22 in which a thermoelectric conversion element is to be formed, where the remaining portion is a heat insulator 35. Next, a heat conductor 36 with which the recess is filled in is formed in accordance with an electroless Cu plating method. Next, a Cu plating film that coats approximately the entire surface is formed and a thin Ti film is formed on the surface in accordance with a spattering method so as to provide a heat incoming/outgoing radiator 37.

Figure 15G:
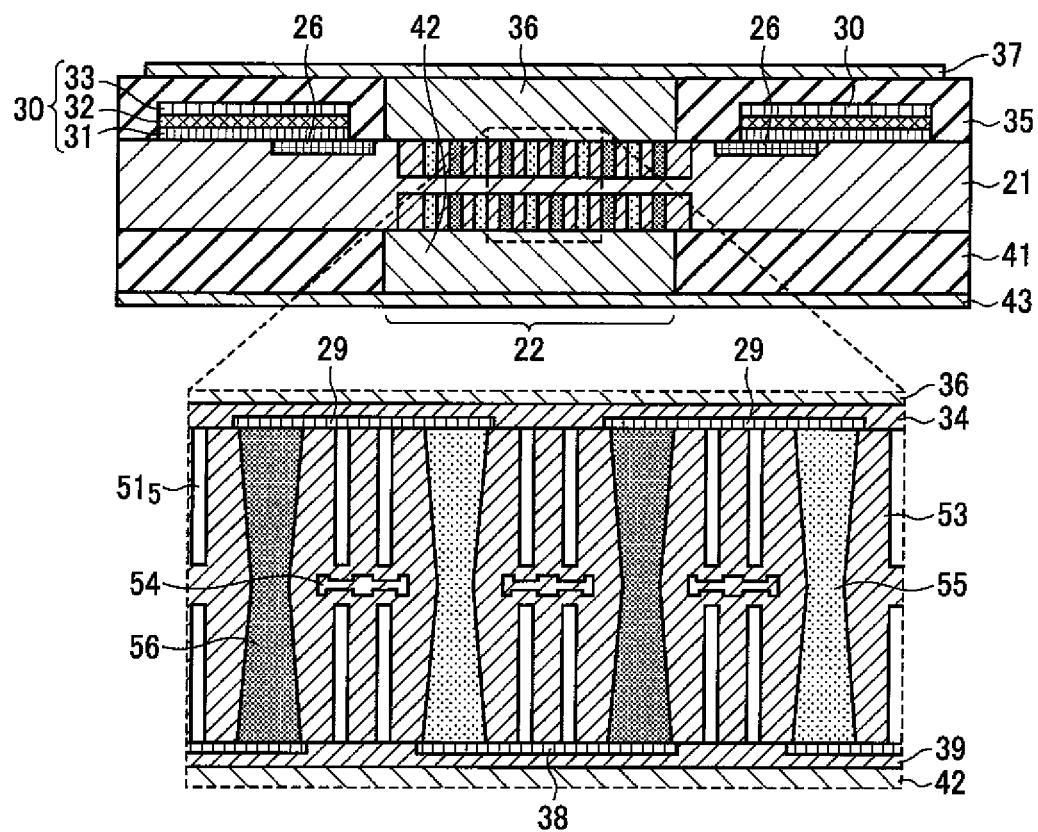
FIG. 15G is a diagram for illustrating a step after the step in FIG. 15F of the manufacturing process for the electronic thermoelectric power generation device according to Example 9 of the present invention.

Next, as illustrated in FIG. 15G, the rear surface of the silicon wafer 21 is etched so as to expose the region 22 in which a thermoelectric conversion element is to be formed, and thus a recess is created. Subsequently, the N type thermoelectric bodies 55 and the P type thermoelectric bodies 56 exposed from the rear surface are connected through connection wires 38 made of Cu, and then an insulating film 39 is formed of alumina in accordance with a spattering method. Subsequently, a heat conductor 42 is formed so as to fill in the recess in accordance with an electroless Cu plating method, and then a Cu plating film is formed so as to coat the entirety of the rear surface, followed by the formation of a thin Ti film on the surface thereof in accordance with a spattering method, and thus a rear heat incoming/outgoing radiator 43 is formed.

After that, though not shown, the silicon wafer 21 is cut into individual pieces having a size of 2 mm×2 mm, which are then coated with a silicone based biocompatible resin, and thus an electronic thermoelectric power generation device that becomes a thermoelectric power generating wireless temperature sensor to be embedded into an organism is completed.

In Example 9 of the present invention, slits 51 are created on both sides, front and rear, of the substrate so that the penetrating rods are two times taller, and therefore the aspect ratio of the N type thermoelectric bodies 27 and the P type thermoelectric bodies 28 that form a thermoelectric conversion element is still higher, which can make the output of thermoelectric power generation much greater. In addition, the penetrating rods are in the form of a long hourglass-shaped hand drum, which prevents the N type thermoelectric bodies 55 and the P type thermoelectric bodies 56 from coming out. Here, in Example 9 as well, the structure in either FIG. 6 or 7 may be adopted.

EXAMPLE 10

Figure 16A:
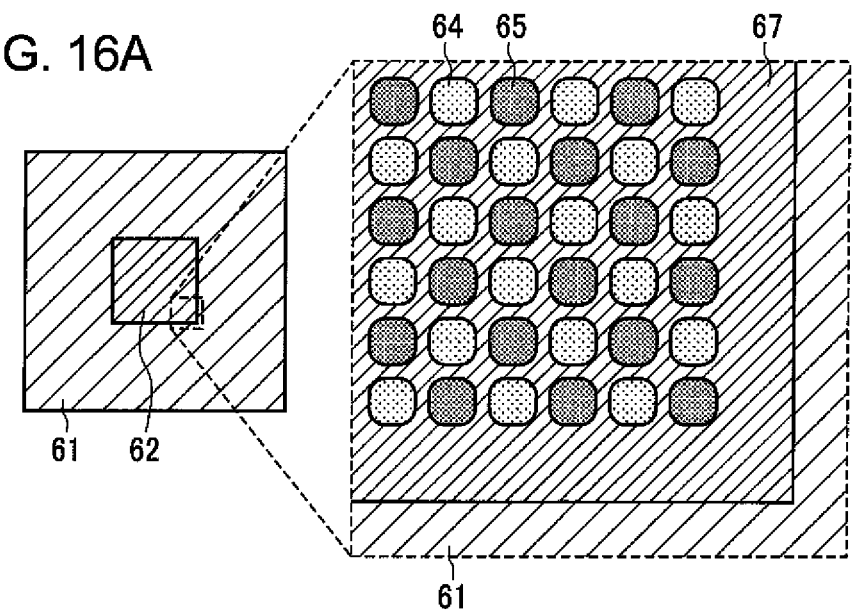
FIGS. 16A and 16B are diagrams illustrating the electronic thermoelectric power generation device according to Example 10 of the present invention in the chip stage.
Figure 16B:
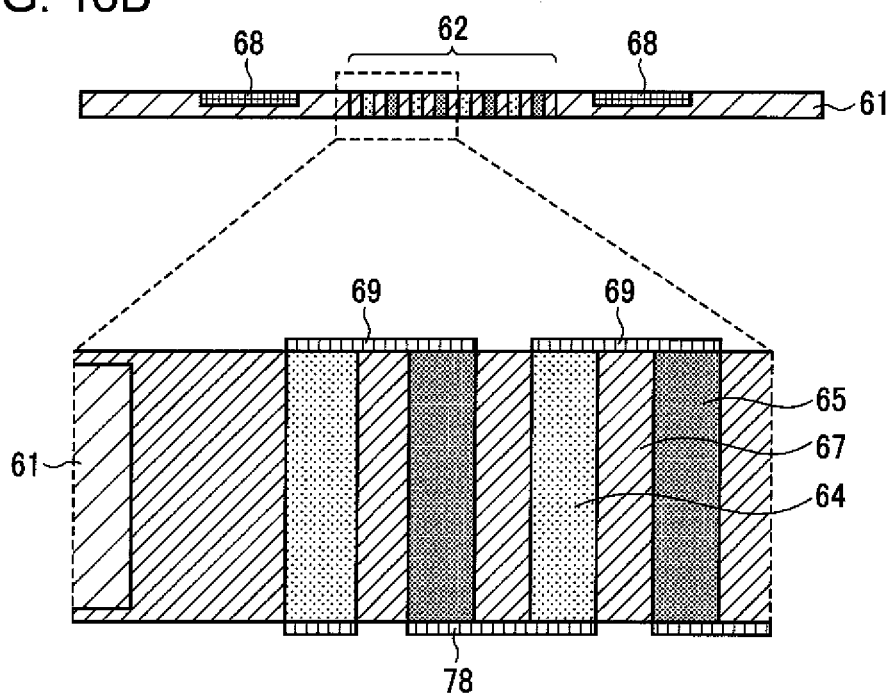

Next, the electronic thermoelectric power generation device according to Example 10 of the present invention is described in reference to FIGS. 16A to 17H. The structure thereof is the same as in Example 1, except that the reinforcement layer is formed of a deposited insulating film. FIGS. 16A and 16B are diagrams illustrating the electronic thermoelectric power generation device according to Example 10 of the present invention in the chip stage. FIG. 16A is a schematic plan diagram and FIG. 16B is a schematic cross-sectional diagram. As illustrated in the figures, a region 62 of 1 mm×1 mm in which a thermoelectric conversion element is to be formed is provided in the center portion of a silicon wafer 61 where a semiconductor circuit 68 is formed.

In the region 62 in which a thermoelectric conversion element is to be formed, N type thermoelectric bodies 64 and P type thermoelectric bodies 65, which are rectangular as viewed from the top with each side bulging out and being curved, are aligned alternately in a two-dimensional matrix form and are embedded in an electrically and thermally insulting layer 67. In addition, the N type thermoelectric bodies 64 and the P type thermoelectric bodies 65 are connected in series through connection wires 69 and connection wires 78 that are on the upper and lower exposed surfaces, respectively, so as to form a thermoelectric conversion element.

Figure 17A:
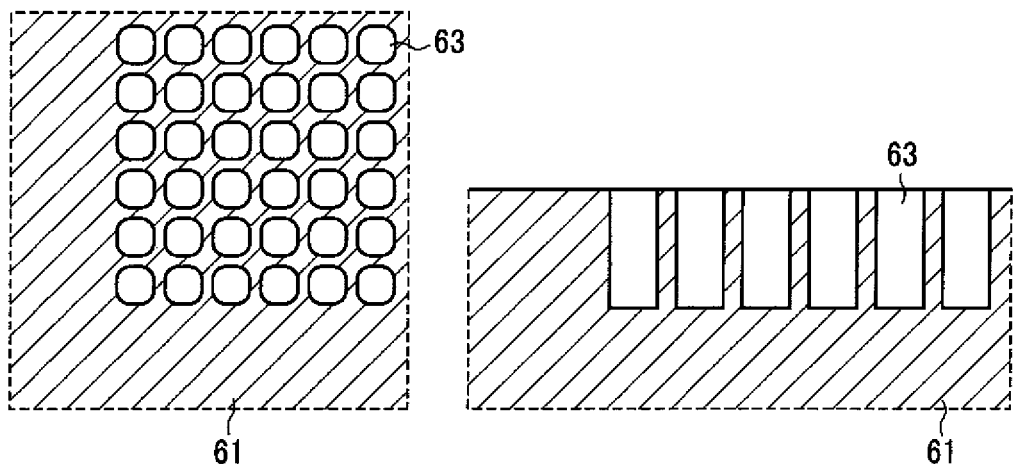
FIGS. 17A and 17B are diagrams for illustrating a step in the middle of the manufacturing process for the electronic thermoelectric power generation device according to Example 10 of the present invention.

Next, the process for manufacturing an electronic thermoelectric power generation device according to Example 10 of the present invention is described in reference to FIGS. 17A to 17H. First, as illustrated in FIG. 17A, a region of 1 mm×1 mm in the center portion of a silicon wafer 61 on the front surface side where semiconductor circuits (not shown) such as a temperature sensor, a signal processing circuit, a wireless circuit, a power supplying circuit and the like are formed is defined as a region 62 in which a thermoelectric conversion element is to be formed. In the region 62 in which a thermoelectric conversion element is to be formed, recesses 63 having a width of 20 μm and a depth of 100 μm are created in a two-dimensional matrix form with intervals of 30 μm in accordance with a Si deep RIE method.

Figure 17B:
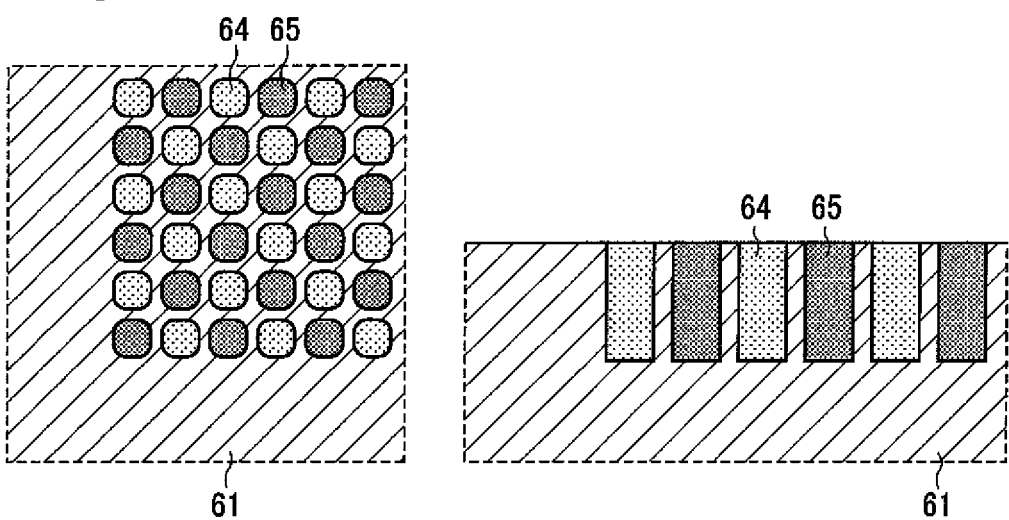

Next, as illustrated in FIG. 17B, the recesses 63 are filled in alternatively with particles of a P type thermoelectric conversion material ($Bi_{0.3}Sb_{1.7}Te_3$) and an N type thermoelectric conversion material ($Bi_2Te_3$), using a metal mask in accordance with an aerosol deposition method. Next, annealing is carried out at 450° C. so as to form N type thermoelectric bodies 64 and P type thermoelectric bodies 65 in rod form.

Figure 17C:
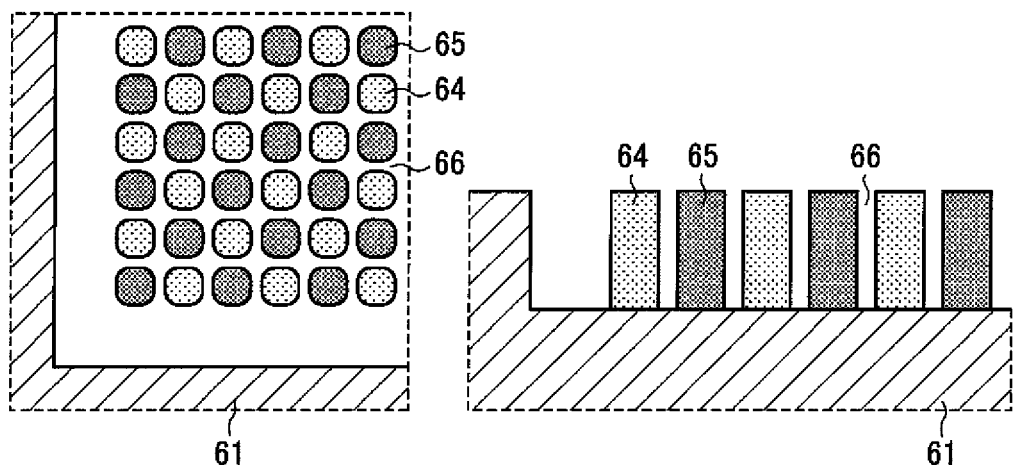
FIGS. 17C and 17D are diagrams for illustrating a step after the step in FIG. 17B of the manufacturing process for the electronic thermoelectric power generation device according to Example 10 of the present invention.

Next, as illustrated in FIG. 17C, a resist mask (not shown) that coats the region other than the region 62 in which a thermoelectric conversion element is to be formed is provided so that the exposed silicon layer is removed through etching in accordance with a Si deep RIE method, and thus the N type thermoelectric bodies 64 and the P type thermoelectric bodies 65 are completely exposed.

Figure 17D:
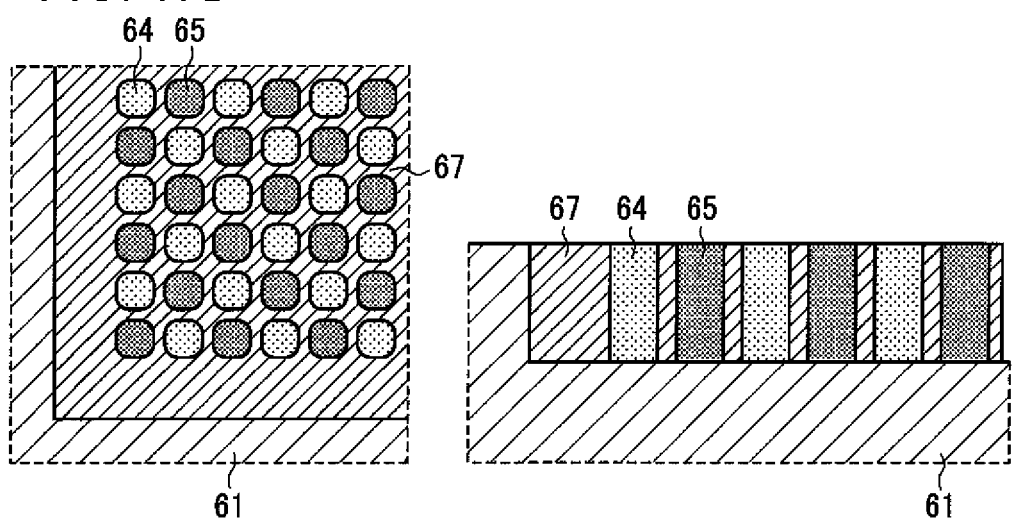

Next, as illustrated in FIG. 17D, in the state where the resist mask remains, $TEOS-SiO_2$ is formed on the portion 66 from which the silicon layer has been removed so as to completely bury the N type thermoelectric bodies 64 and the P type thermoelectric bodies 65 in accordance with a CVD method, and thus a thermally and electrically insulating layer 67 is provided.

Figure 17E:
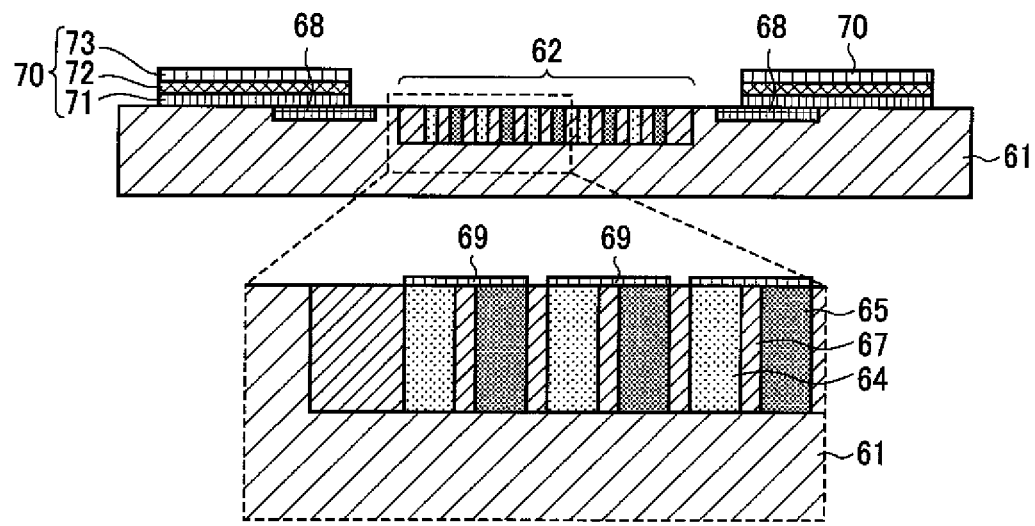

Next, as illustrated in FIG. 17E, connection wires 69 that connect the N type thermoelectric bodies 64 and the P type thermoelectric bodies 65 are formed of Cu. In addition, an all-solid-state Li ion battery 70 having a size of 1.8 mm×1.8 mm is formed outside the region 62 in which a thermoelectric conversion element of 1 mm×1 mm is to be formed. The all-solid-state Li ion battery 70 is formed of a cathode 71 made of $LiCo_2$, a solid electrolyte 72 made of LiPON and an anode 73 made of Li, which are layered on top of each other in this order through spattering. Though not shown, current collectors are formed of Pt on the cathode 71 and the anode 73, respectively.

Figure 17F:
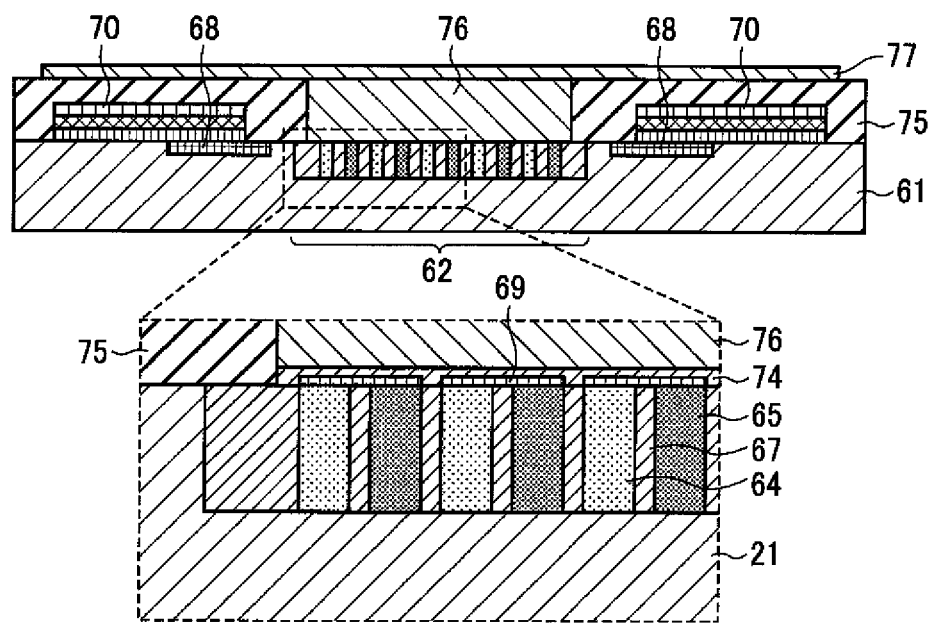

Next, as illustrated in FIG. 17F, an insulating film 74 is formed of alumina in accordance with a spattering method, and then is coated with a foamed polyolefine-based heat insulating resin having a thickness of approximately 0.5 mm. Subsequently, a recess is provided through laser drilling so as to expose the major portion of the region 62 in which a thermoelectric conversion element is to be formed, where the remaining portion is a heat insulator 75. Next, the recess is filled in with a heat conductor 72 that is formed in accordance with an electroless Cu plating method. Next, a Cu plating film is formed so as to coat approximately the entire surface and a thin Ti film is formed on the surface thereof in accordance with a spattering method, and thus a heat incoming/outgoing radiator 77 is provided.

Figure 17G:
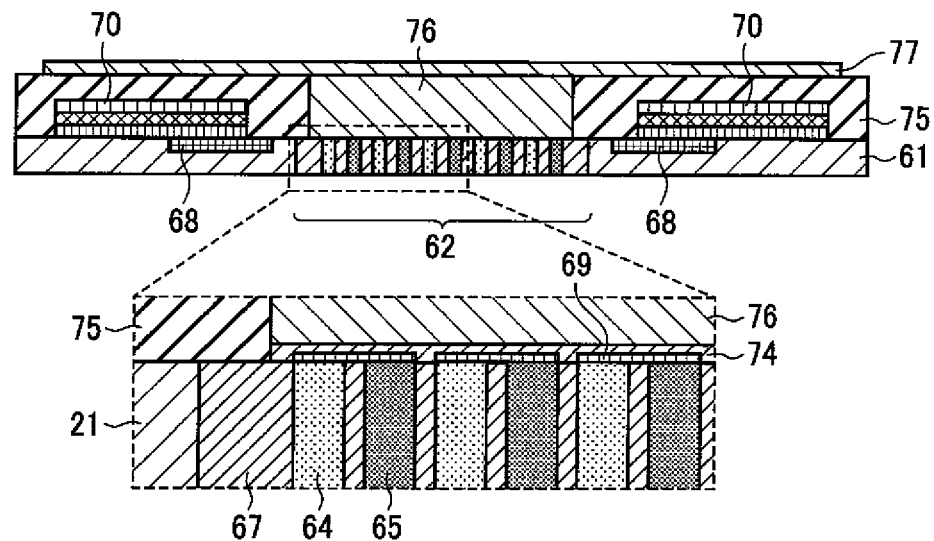
FIGS. 17G and 17H are diagrams for illustrating a step after the step in FIG. 17F of the manufacturing process for the electronic thermoelectric power generation device according to Example 10 of the present invention.

Next, as illustrated in FIG. 17G, the rear surface of the silicon wafer 61 is polished according to a mechanical polishing method so that the thickness is reduced to 100 μm and the N type thermoelectric bodies 64 and the P type thermoelectric bodies 65 are exposed from the rear surface.

Figure 17H:
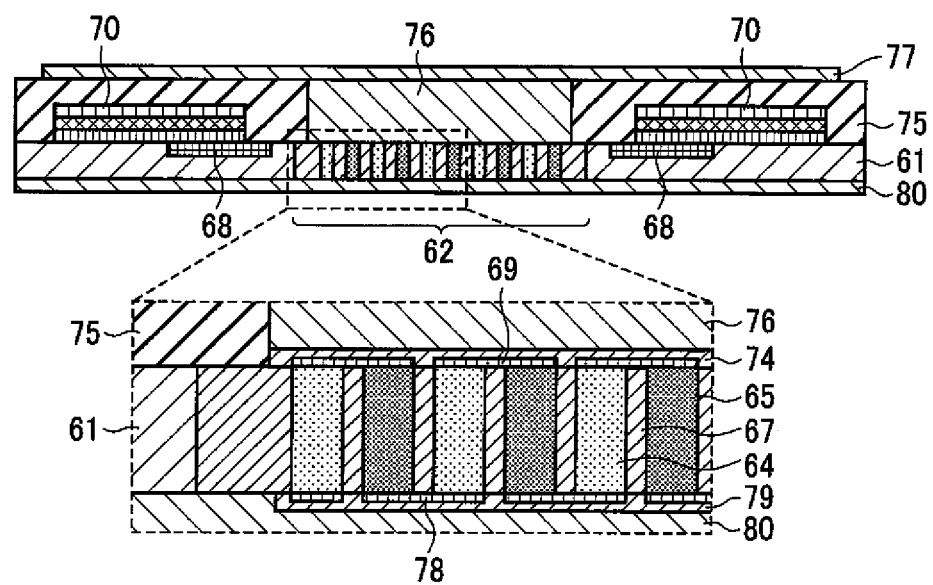

Next, as illustrated in FIG. 17H, the N type thermoelectric bodies 64 and the P type thermoelectric bodies 65 exposed from the rear surface are connected through connection wires 78 made of Cu, and then an insulating film 79 is formed of alumina in accordance with a spattering method. Subsequently, a Cu plating film is formed in accordance with an electroless Cu plating method so as to coat the entirety of the rear surface and a thin Ti film is formed on the surface thereof in accordance with a spattering method, and thus a rear heat incoming/outgoing radiator 80 is formed.

After that, though not shown, the silicon wafer 61 is cut into individual pieces having a size of 2 mm×2 mm, which are then coated with a silicone based biocompatible resin, and thus an electronic thermoelectric power generation device that becomes a thermoelectric power generating wireless temperature sensor to be embedded into an organism is completed.

In Example 10 of the present invention, the reinforcement layer is formed of CVD-SiO$_2$ instead of thermally oxidized SiO$_2$, and therefore the recesses to be filled in are not deformed through thermal oxidation and penetrating rods can be formed with high precision. In this case, it is not necessary for the wafer to be a silicon wafer, and a compound semiconductor wafer such as of GaAs can also be used. In Example 10 as well, the structure in any of FIGS. 5 to 9 may be adopted.

EXAMPLE 11

Figure 18A:
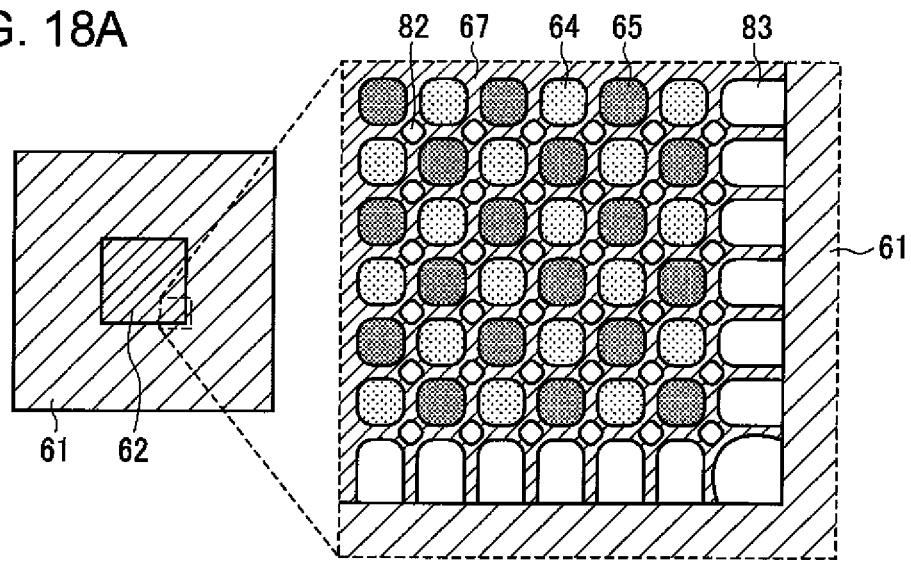
FIGS. 18A and 18B are diagrams illustrating the electronic thermoelectric power generation device according to Example 11 of the present invention in the chip stage.
Figure 18B:
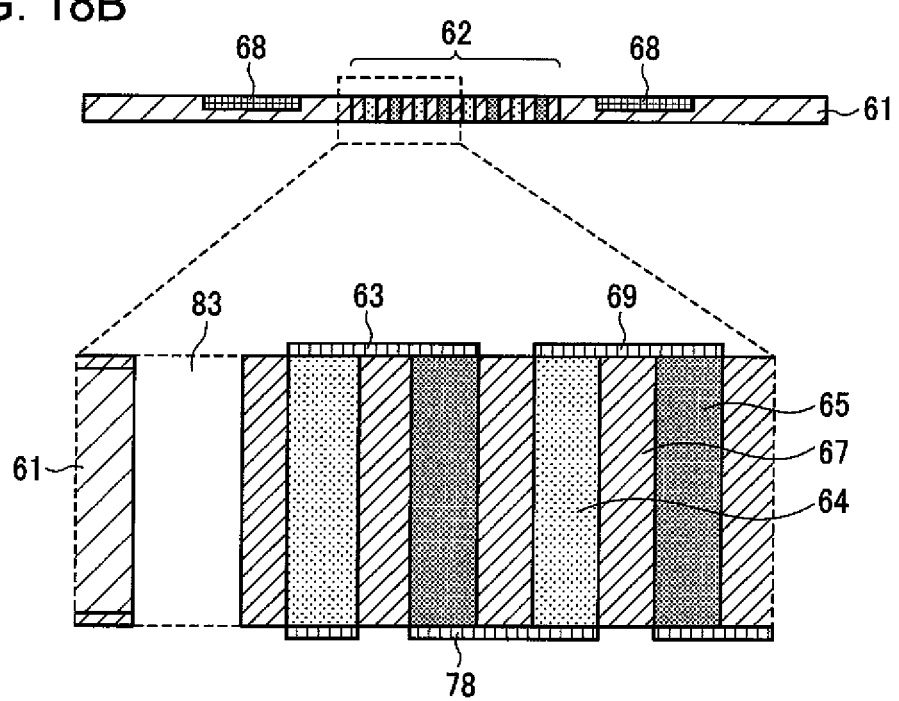

Next, the electronic thermoelectric power generation device according to Example 11 of the present invention is described in reference to FIGS. 18A to 19F. The structure thereof is the same as in Example 1, except that the reinforcement layer is formed of a deposited insulating film in which internal gaps that are not in slit form are provided. FIGS. 18A and 18B are diagrams illustrating the electronic thermoelectric power generation device according to Example 11 of the present invention in the chip stage. FIG. 18A is a schematic plan diagram and FIG. 18B is a schematic cross-sectional diagram. As illustrated in the figures, a region 62 of 1 mm×1 mm in which a thermoelectric conversion element is to be formed is provided in the center portion of a silicon wafer 61 where a semiconductor circuit 68 is formed.

In the region 62 in which a thermoelectric conversion element is to be formed, N type thermoelectric bodies 64 and P type thermoelectric bodies 65, which are rectangular as viewed from the top with each side bulging out and being curved, are aligned alternately in a two-dimensional matrix form and are embedded in an electrically and thermally insulting layer 67. At this time, internal gaps 82 are provided between N type thermoelectric bodies 64 and P type thermoelectric bodies 65 that are adjacent to each other along the diagonal lines of the matrix. In addition, peripheral gaps 83 having a great size are created in the vicinity of the border vis-à-vis the silicon wafer 61. Furthermore, the N type thermoelectric bodies 64 and the P type thermoelectric bodies 65 are connected in series through connection wires 69 and connection wires 78 that are on the upper and lower exposed surfaces, respectively, so as to form a thermoelectric conversion element.

Figure 19A:
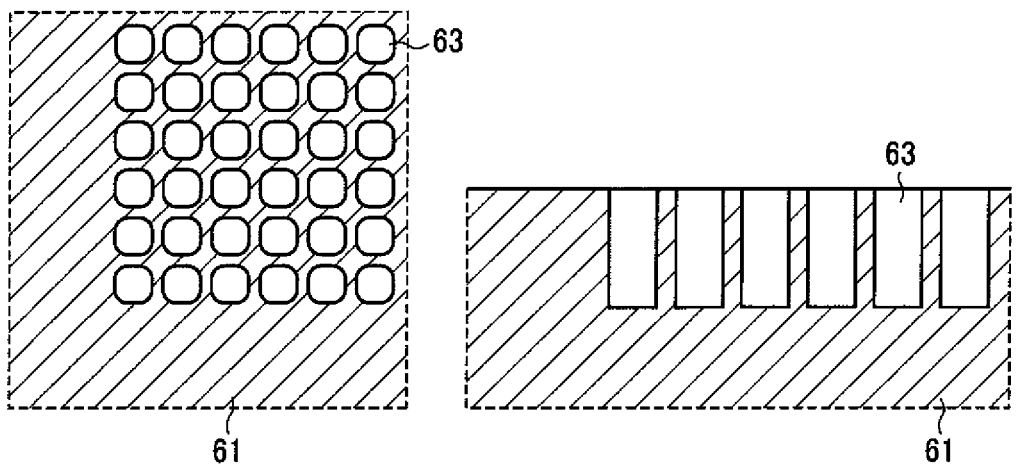
FIGS. 19A and 19B are diagrams for illustrating a step in the middle of the manufacturing process for the electronic thermoelectric power generation device according to Example 11 of the present invention.

Next, the process for manufacturing an electronic thermoelectric power generation device according to Example 11 of the present invention is described in reference to FIGS. 19A to 19F. First, as illustrated in FIG. 19A and in the same manner as in Example 10, a region of 1 mm×1 mm in the center portion of a silicon wafer 61 on the front surface side where semiconductor circuits (not shown) such as a temperature sensor, a signal processing circuit, a wireless circuit, a power supplying circuit and the like are formed is defined as a region 62 in which a thermoelectric conversion element is to be formed. In the region 62 in which a thermoelectric conversion element is to be formed, recesses 63 having a width of 20 μm and a depth of 100 μm are created in a two-dimensional matrix form with intervals of 30 μm in accordance with a Si deep RIE method.

Figure 19B:
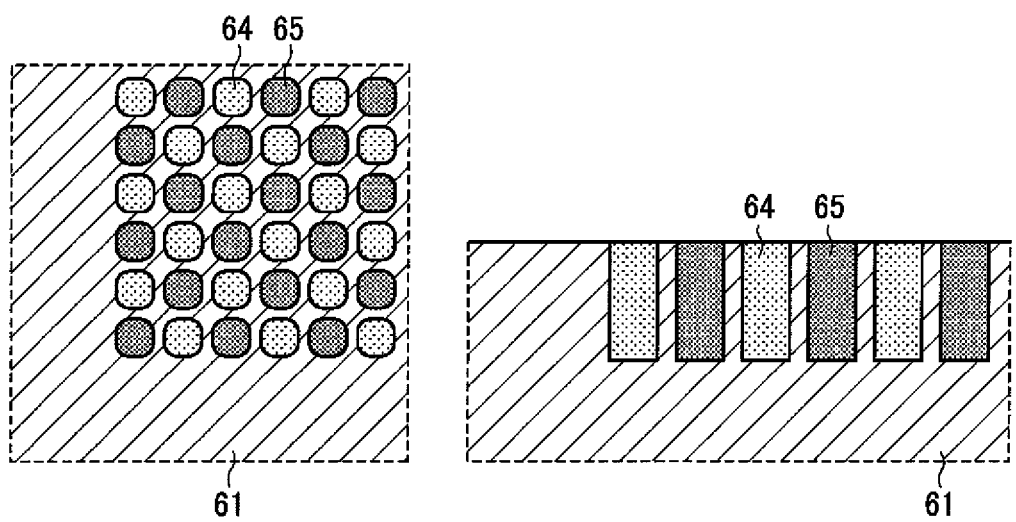

Next, as illustrated in FIG. 19B, the recesses 63 are filled in alternatively with particles of a P type thermoelectric conversion material (Bi$_{0.3}$Sb$_{1.7}$Te$_3$) and an N type thermoelectric conversion material (Bi$_2$Te$_3$), using a metal mask in accordance with an aerosol deposition method. Next, annealing is carried out at 450° C. so as to form N type thermoelectric bodies 64 and P type thermoelectric bodies 65 in rod form.

Figure 19C:
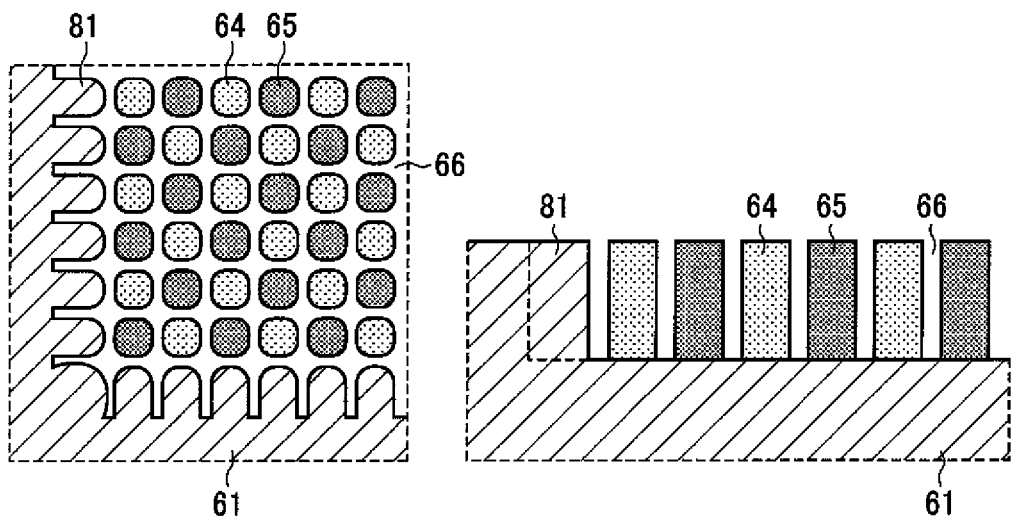
FIGS. 19C and 19D are diagrams for illustrating a step after the step in FIG. 19B of the manufacturing process for the electronic thermoelectric power generation device according to Example 11 of the present invention.

Next, as illustrated in FIG. 19C, a resist mask (not shown) that coats the region other than the region 62 in which a thermoelectric conversion element is to be formed is provided so that the exposed silicon layer is removed through etching in accordance with a Si deep RIE method, and thus the N type thermoelectric bodies 64 and the P type thermoelectric bodies 65 are completely exposed. At this time, the etching allows a region 81 in which gaps are to be created to remain in the peripheral portion of the region 62 in which a thermoelectric conversion element is to be formed.

Figure 19D:
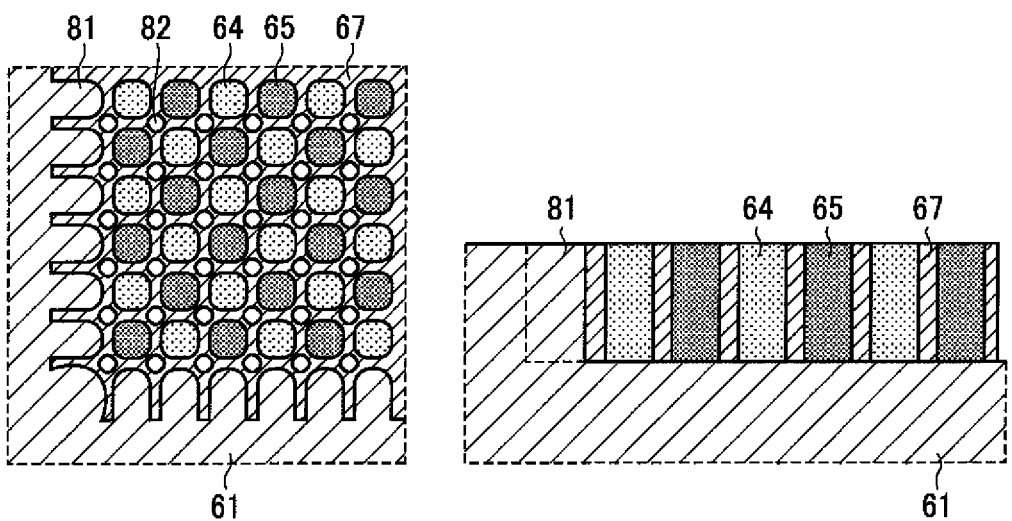

Next, as illustrated in FIG. 19D, in the state where the resist mask remains, TEOS-SiO$_2$ is formed on the portion 66 from which the silicon layer has been removed so as to completely bury the N type thermoelectric bodies 64 and the P type thermoelectric bodies 65 in accordance with a CVD method, and thus a thermally and electrically insulating layer 67 is provided. At this time, the period of time during which the film is formed is adjusted so that internal gaps 82 are created between N type thermoelectric bodies 64 and P type thermoelectric bodies 65 that are adjacent to each other along the diagonal lines of the matrix.

Figure 19E:
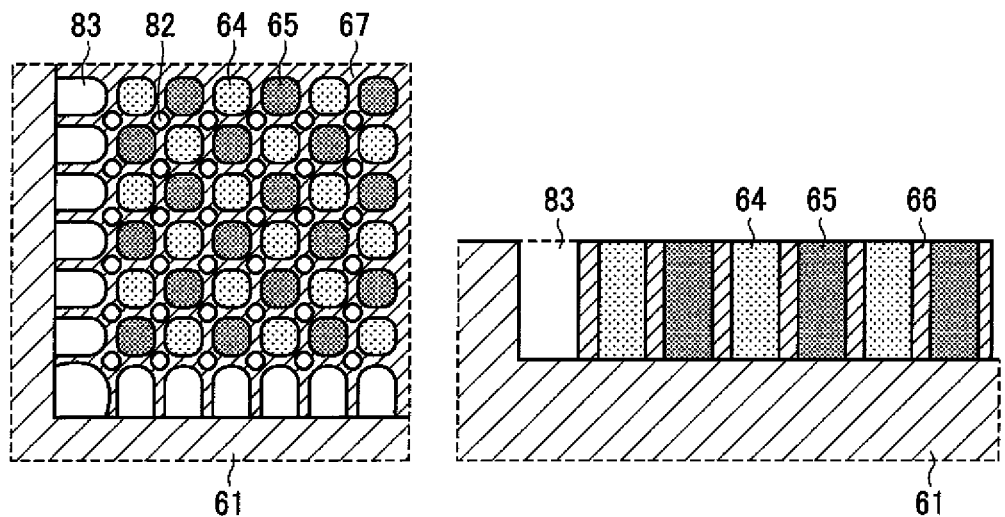
FIGS. 19E and 19F are diagrams for illustrating a step after the step in FIG. 19D of the manufacturing process for the electronic thermoelectric power generation device according to Example 11 of the present invention.

Next, as illustrated in FIG. 19E, a patterned resist (not shown) is used as a mask so as to selectively etch and remove the silicon layer that has remained in the region 81 in which gaps are to be created, and thus peripheral gaps 83 having a great size are created.

Figure 19F:
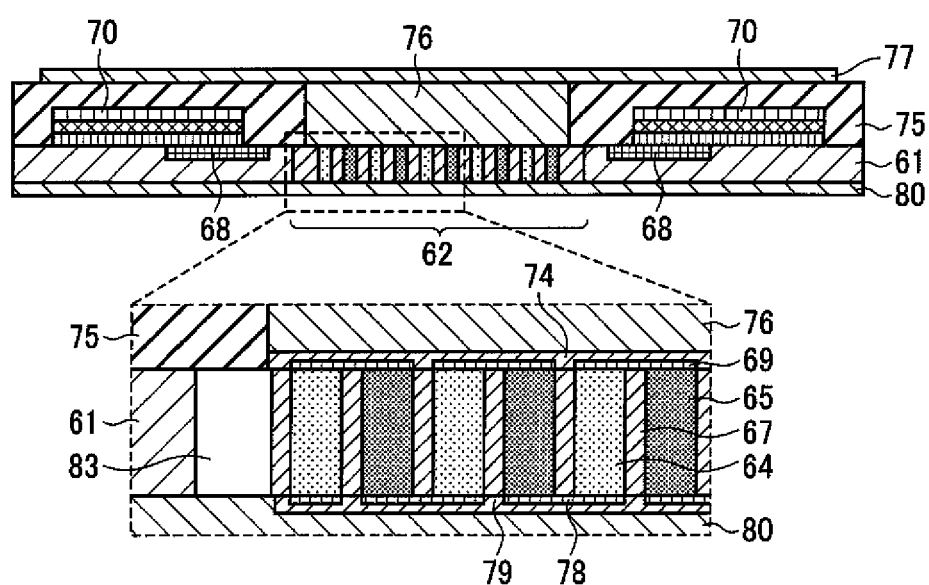

After that, as illustrated in FIG. 19F, connection wires 69 that connect the N type thermoelectric bodies 64 and the P type thermoelectric bodies 65 are formed of Cu. In addition, an all-solid-state Li ion battery 70 having a size of 1.8 mm×1.8 mm is formed outside the region 62 in which a thermoelectric conversion element of 1 mm×1 mm is to be formed. The all-solid-state Li ion battery 70 is formed of a cathode made of LiCo$_2$, a solid electrolyte made of LiPON and an anode made of Li, which are layered on top of each other in this order through spattering.

Next, an insulating film 74 is formed of alumina in accordance with a spattering method, and then is coated with a foamed polyolefine-based heat insulating resin having a thickness of approximately 0.5 mm. Subsequently, a recess is provided through laser drilling so as to expose the major portion of the region 62 in which a thermoelectric conversion element is to be formed, where the remaining portion is a heat insulator 75. Next, the recess is filled in with a heat conductor 72 that is formed in accordance with an electroless Cu plating method. Next, a Cu plating film is formed so as to coat approximately the entire surface and a thin Ti film is formed on the surface thereof in accordance with a spattering method, and thus a heat incoming/outgoing radiator 77 is provided.

Next, the rear surface of the silicon wafer 61 is polished according to a mechanical polishing method so that the thickness is reduced to 100 μm and the N type thermoelectric bodies 64 and the P type thermoelectric bodies 65 are exposed from the rear surface. Subsequently, the N type thermoelectric bodies 64 and the P type thermoelectric bodies 65 exposed from the rear surface are connected through connection wires 78 made of Cu, and then an insulating film 79 is formed of alumina in accordance with a spattering method. Subsequently, a Cu plating film is formed in accordance with an electroless Cu plating method so as to coat the entirety of the rear surface and a thin Ti film is formed on the surface thereof in accordance with a spattering method, and thus a rear heat incoming/outgoing radiator 80 is formed.

After that, though not shown, the silicon wafer 61 is cut into individual pieces having a size of 2 mm×2 mm, which are then coated with a silicone based biocompatible resin, and thus an electronic thermoelectric power generation device that becomes a thermoelectric power generating wireless temperature sensor to be embedded into an organism is completed.

In Example 11 of the present invention, internal gaps are provided within the thermally and electrically insulating layer, and at the same time peripheral gaps having a great size are provided in the peripheral portion, and therefore the thermal resistance of the reinforcement layer that includes the thermally and electrically insulating layer can be increased. The thus fabricated thermoelectric power generating wireless temperature sensor can wirelessly transmit temperature data approximately once every six hours when there is a difference of 1° C. in temperature between the front and rear surfaces.

In this case, it is not necessary for the wafer to be a silicon wafer, and a compound semiconductor wafer such as of GaAs can also be used. In Example 11 as well, the structure in any of FIGS. 5 to 9 may be adopted.

EXAMPLE 12

Figure 20A:
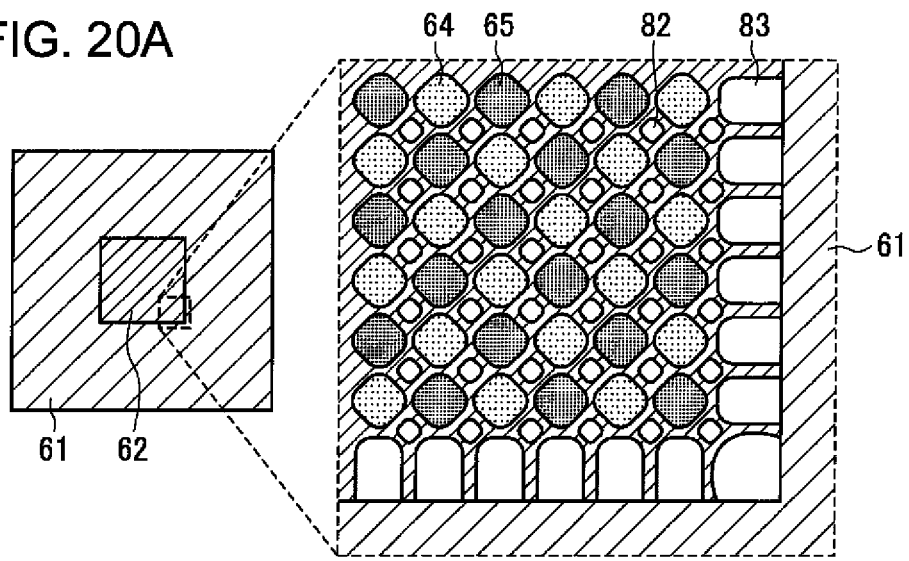
FIGS. 20A and 20B are diagrams illustrating the electronic thermoelectric power generation device according to Example 12 of the present invention in the chip stage.
Figure 20B:
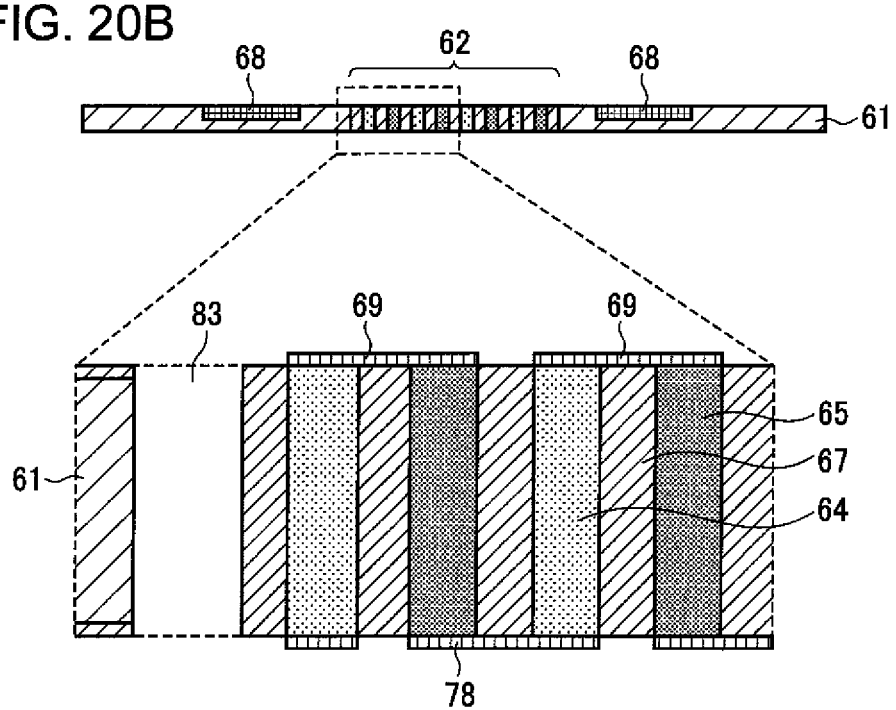

Next, the electronic thermoelectric power generation device according to Example 12 of the present invention is described in reference to FIGS. 20A to 21F. The basic structure thereof is the same as in Example 11, except that the arrangement of the N type thermoelectric bodies and the P type thermoelectric bodies as viewed from the top is different, and the peripheral portion of the substrate is thicker. FIGS. 20A and 20B are diagrams illustrating the electronic thermoelectric power generation device according to Example 12 of the present invention in the chip stage. FIG. 20A is a schematic plan diagram and FIG. 20B is a schematic cross-sectional diagram. As illustrated in the figures, a region 62 of 1 mm×1 mm in which a thermoelectric conversion element is to be formed is provided in the center portion of a silicon wafer 61 on which a semiconductor circuit 68 is formed.

In the region 62 in which a thermoelectric conversion element is to be formed, rectangular N type thermoelectric bodies 64 and rectangular P type thermoelectric bodies of which the corners are rounded as viewed from the top are alternately aligned in a two-dimensional matrix so that the diagonal lines are aligned in the column direction and in the row direction, and are embedded in a thermally and electrically insulating layer 67 made of TEOS-SiO$_2$.

At this time, internal gaps 82 are provided between N type thermoelectric bodies 64 and P type thermoelectric bodies 65 that are adjacent to each other along the diagonal lines of the matrix. In addition, peripheral gaps 83 having a great size are created in the vicinity of the border of the silicon wafer 61. Furthermore, the N type thermoelectric bodies 64 and the P type thermoelectric bodies 65 are connected in series through connection wires 69 and connection wires 78 on the upper and lower exposed surfaces, respectively, so as to form a thermoelectric conversion element.

Figure 21A:
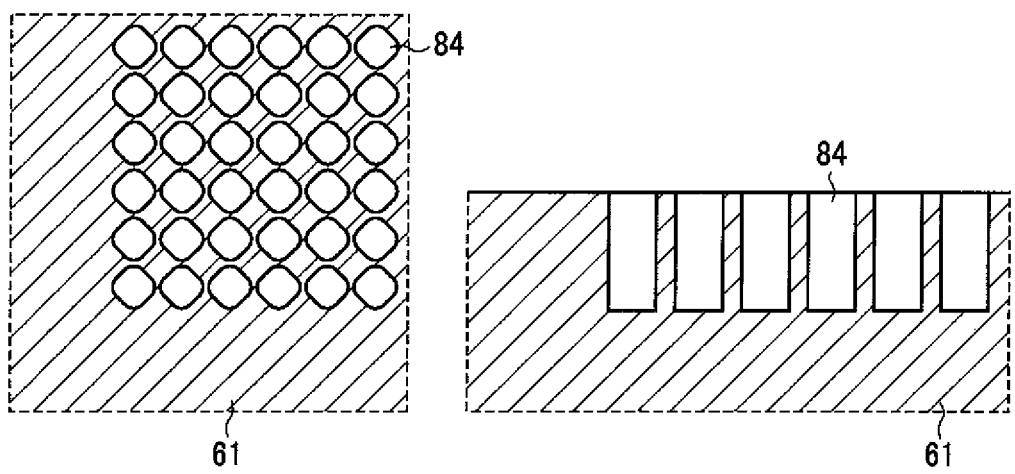
FIGS. 21A and 21B are diagrams for illustrating a step in the middle of the manufacturing process for the electronic thermoelectric power generation device according to Example 12 of the present invention.

Next, the process for manufacturing an electronic thermoelectric power generation device according to Example 12 of the present invention is described in reference to FIGS. 21A to 21F. First, as illustrated in FIGS. 21A, a region of 1 mm×1 mm in the center portion on the front surface side of a silicon wafer 61 having a semiconductor circuit including a temperature sensor, a signal processing circuit, a wireless circuit, a power supplying circuit and the like (not shown) is defined as a region 62 in which a thermoelectric conversion element is to be formed. In the region 62 in which a thermoelectric conversion element is to be formed, rectangular recesses 84 having a width of 20 µm and a depth of 100 µm are created in a two-dimensional matrix form in such a state as being rotated by 45° and with intervals of 35 µm in accordance with a Si deep RIE method.

Figure 21B:
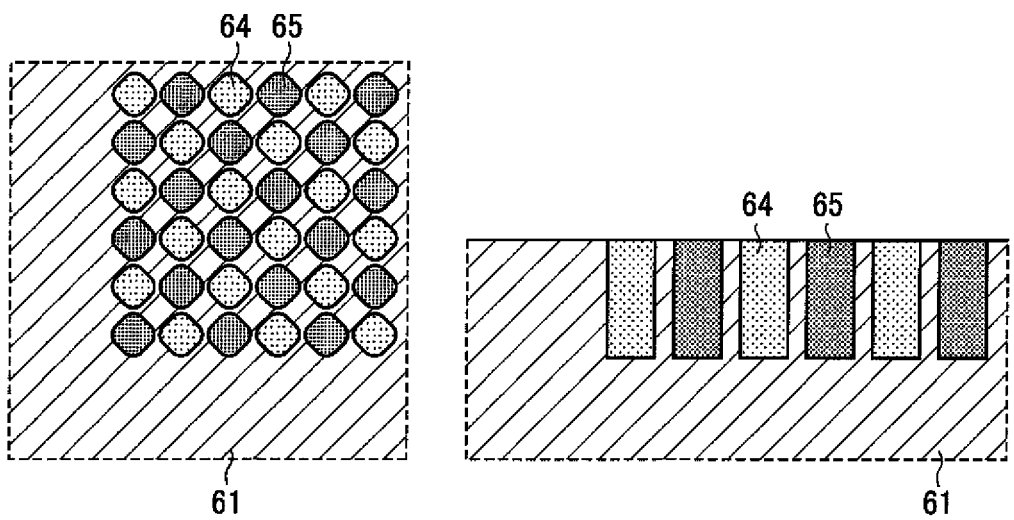

Next, as illustrated in FIG. 21B, the recesses 84 are filled in alternatively with particles of a P type thermoelectric conversion material (Bi$_{0.3}$Sb$_{1.7}$Te$_3$) and an N type thermoelectric conversion material (Bi$_2$Te$_3$), using a metal mask in accordance with an aerosol deposition method. Next, annealing is carried out at 450° C. so as to form N type thermoelectric bodies 64 and P type thermoelectric bodies 65 in rod form.

Figure 21C:
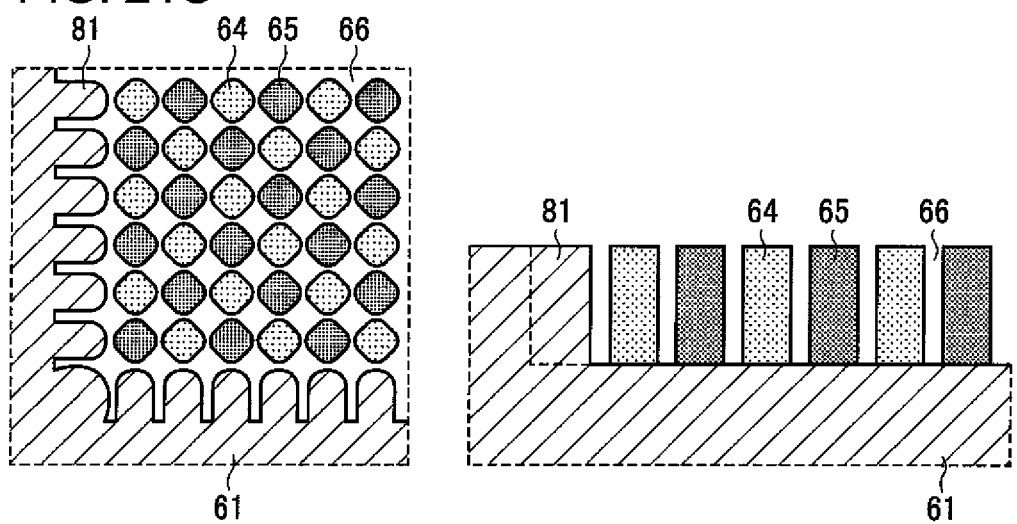
FIGS. 21C and 21D are diagrams for illustrating a step after the step in FIG. 21B of the manufacturing process for the electronic thermoelectric power generation device according to Example 12 of the present invention.

Next, as illustrated in FIG. 21C, a resist mask (not shown) that coats the region other than the region 62 in which a thermoelectric conversion element is to be formed is provided so that the exposed silicon layer is removed through etching in accordance with a Si deep RIE method, and thus the N type thermoelectric bodies 64 and the P type thermoelectric bodies 65 are completely exposed. At this time, a region 81 in which gaps are to be created remains in the peripheral portion of the region 62 in which a thermoelectric conversion element is to be formed after etching.

Figure 21D:
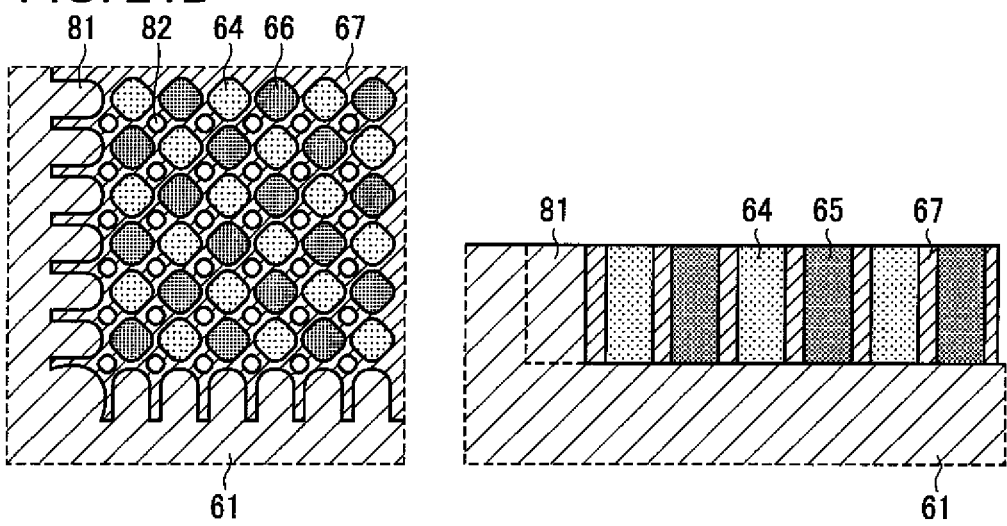

Next, as illustrated in FIG. 21D, in the state where the resist mask remains, TEOS-SiO$_2$ is formed on the portion 66 from which the silicon layer has been removed so as to completely bury the N type thermoelectric bodies 64 and the P type thermoelectric bodies 65 in accordance with a CVD method, and thus a thermally and electrically insulating layer 67 is provided. At this time, the period of time during which the film grows is adjusted so that internal gaps 82 are created between N type thermoelectric bodies 64 and P type thermoelectric bodies 65 that are adjacent to each other along the diagonal lines of the matrix.

Figure 21E:
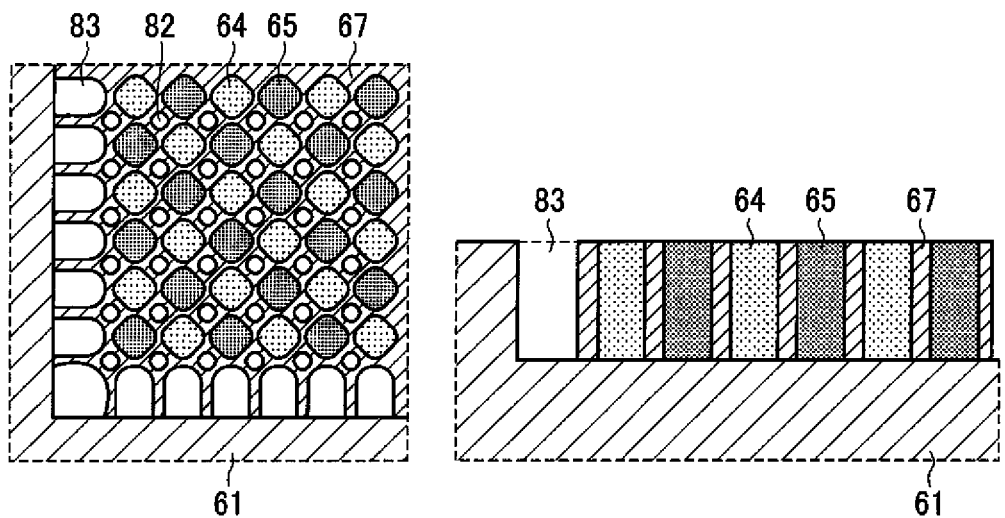
FIGS. 21E and 21F are diagrams for illustrating a step after the step in FIG. 21D of the manufacturing process for the electronic thermoelectric power generation device according to Example 12 of the present invention.

Next, as illustrated in FIG. 21E, the patterned resist (not shown) is used as a mask so as to selectively remove through etching the silicon layer that remains in the region 81 in which gaps are to be created, and thus peripheral gaps 83 having a great size are created.

Figure 21F:
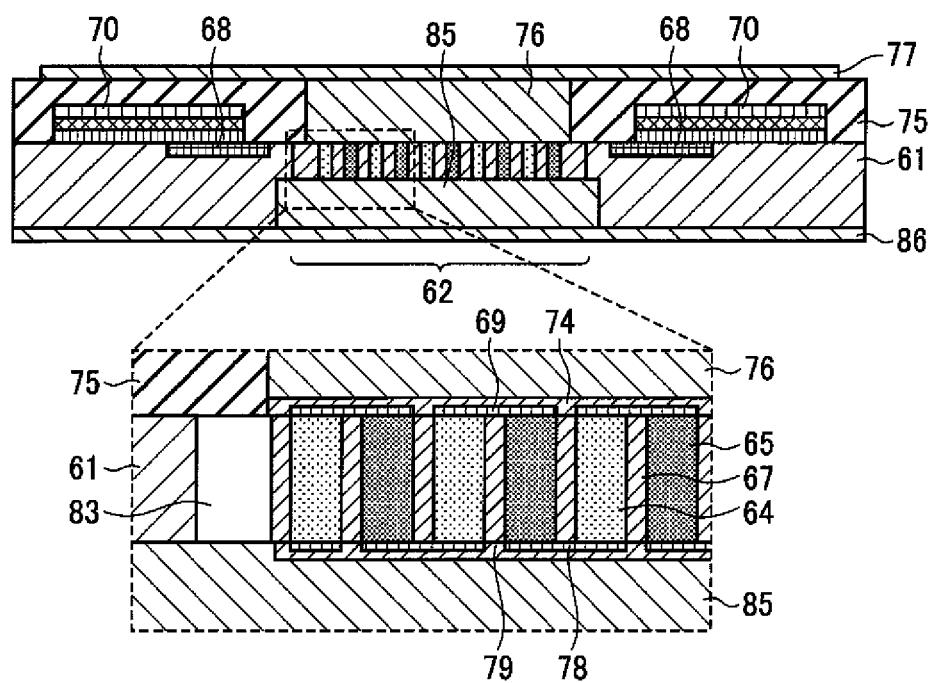

After that, as illustrated in FIG. 21F, connection wires 69 that connect the N type thermoelectric bodies 64 and the P type thermoelectric bodies 65 are formed of Cu. In addition, an all-solid-state Li ion battery 70 having a size of 1.8 mm×1.8 mm is formed outside the region 62 in which a thermoelectric conversion element of 1 mm×1 mm is to be formed. The all-solid-state Li ion battery 70 is formed of a cathode made of LiCo$_2$, a solid electrolyte made of LiPON and an anode made of Li, which are layered on top of each other in this order through spattering.

Next, an insulating film 74 is formed of alumina in accordance with a spattering method, and then is coated with a foamed polyolefine-based heat insulating resin having a thickness of approximately 0.5 mm. Subsequently, a recess is provided through laser drilling so as to expose the major portion of the region 62 in which a thermoelectric conversion element is to be formed, where the remaining portion is a heat insulator 75. Next, the recess is filled in with a heat conductor 72 that is formed in accordance with an electroless Cu plating method. Next, a Cu plating film is formed so as to coat approximately the entire surface and a thin Ti film is formed on the surface thereof in accordance with a spattering method, and thus a heat incoming/outgoing radiator 77 is provided.

Next, the region that corresponds to the region 62 in which a thermoelectric conversion element is to be formed is selectively plasma etched so as to expose the N type thermoelectric bodies 64 and the P type thermoelectric bodies 65 from the rear surface. Subsequently, the N type thermoelectric bodies 64 and the P type thermoelectric bodies 65 that have been exposed from the rear surface are connected through connection wires 78, and then an insulating film 79 is formed of alumina in according with a spattering method. Next, the recess is filled in with a heat conductor 85 that is formed in accordance with an electroless Cu plating method. Next, a Cu plating film is formed so as to coat the entirety of the rear surface, and a thin Ti film is formed on the surface thereof in accordance with a spattering method so as to form a rear heat incoming/outgoing radiator 86.

After that, though not shown, the silicon wafer 61 is cut into individual pieces having a size of 2 mm×2 mm, which are then coated with a silicone based biocompatible resin, and thus an electronic thermoelectric power generation device that becomes a thermoelectric power generating wireless temperature sensor to be embedded into an organism is completed.

In Example 12 of the present invention, internal gaps are provided within the thermally and electrically insulating layer, and at the same time peripheral gaps having a great size are provided in the peripheral portion, and therefore the thermal resistance of the reinforcement layer that includes the thermally and electrically insulating layer can be increased. The thus fabricated thermoelectric power generating wireless temperature sensor can wirelessly transmit temperature data approximately once every six hours when there is a difference of 1° C. in temperature between the front and rear surfaces. Here, in Example 12, the peripheral portion of the silicon substrate is thick, and therefore the effects of the heat source on the semiconductor circuit can be reduced.

In this case also, it is not necessary for the wafer to be a silicon wafer, and a compound semiconductor wafer such as of GaAs may be used. Here, the same structure as that illustrated in any of FIGS. 5 to 9 may be adopted in Example 11 as well.

While examples are described in the above, the location and the form of the provided region in which a thermoelectric conversion element is to be formed can be any location and any form. In addition, the form and the size of the penetrating rods as viewed from the top, as well as the height and the intervals of the penetrating rods, can be of any form, size, height or interval which can be appropriately determined in accordance with the purpose of use of the electronic thermoelectric power generation device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device, comprising:
   a semiconductor substrate with a through opening for a region in which a thermoelectric conversion element is to be formed; and
   a thermoelectric conversion element embedded in the through opening, characterized in that the thermoelectric conversion element includes:
   a number of penetrating rods made of a thermoelectric conversion material; and
   an insulating reinforcement layer in which the penetrating rods are embedded and of which the thermal conductivity is lower than that of the thermoelectric conversion material, wherein the insulating reinforcement layer has either a number of gaps that penetrate through the reinforcement layer or a number of gaps that are not deep enough to penetrate through the insulating reinforcement layer.

2. The semiconductor device according to claim 1, wherein the insulating reinforcement layer is made of thermally oxidized $SiO_2$.

3. The semiconductor device according to claim 1, wherein the insulating reinforcement layer is made of a deposited insulating film of which the thermal conductivity is lower than that of the semiconductor substrate.

4. The semiconductor device according to claim 1, wherein the penetrating rods are provided in a two-dimensional matrix form and the gaps are slits provided between penetrating rods that are adjacent to each other in the direction in which the penetrating rods are aligned.

5. The semiconductor device according to claim 1, wherein the penetrating rods are provided in a two-dimensional matrix form and the gaps are gaps that are not in slit form provided between penetrating rods that are adjacent to each other in a diagonal direction.

6. The semiconductor device according to claim 5, wherein a peripheral portion that is adjacent to the semiconductor substrate of the insulating reinforcement layer comprises gaps that are greater than the gaps that are not in slit form.

7. The semiconductor device according to claim 1, wherein a semiconductor circuit is formed on the semiconductor substrate.

8. The semiconductor device according to claim 1, wherein at least the thickness of the peripheral portion of the semiconductor substrate is greater than the thickness of the thermoelectric conversion element.

9. An electronic thermoelectric power generation device, comprising:
   a semiconductor substrate with a through opening for a region in which a thermoelectric conversion element is to be formed; and
   a thermoelectric conversion element embedded in the through opening, wherein
   the thermoelectric conversion element includes:
   a number of penetrating rods made of a thermoelectric conversion material;
   an insulating reinforcement layer in which the penetrating rods are embedded and of which the thermal conductivity is lower than that of the thermoelectric conversion material; and
   a semiconductor circuit formed on a main surface of the semiconductor substrate, and the thermoelectric generator device further comprises:
an electronic part mounted on at least either a main surface or a rear surface of the semiconductor substrate;
a heat insulator that coats the electronic part;
heat incoming/outgoing radiators formed on the main surface and rear surface sides of the semiconductor substrate; and
a heat conductor for thermally connecting at least one of the heat incoming/outgoing radiators to the thermoelectric conversion element.

10. The electronic thermoelectric power generation device according to claim 9, wherein the electronic part is an all-solid-state secondary battery, and the semiconductor circuit is involved in electrical connection where the all-solid-state secondary battery is a power source.

11. A method for manufacturing a semiconductor device, comprising:
forming a number of rods of a thermoelectric conversion material on a front surface side of a region of a semiconductor wafer in which a thermoelectric conversion element is to be formed; and
covering the rods with an insulating reinforcement layer of which the thermal conductivity is lower than that of the semiconductor wafer, wherein the semiconductor wafer is a silicon wafer,
the formation of the rods includes:
creating a number of first deep trenches and a number of second deep trenches of which the width is narrower than that of the first deep trenches in the silicon wafer;
thermally oxidizing silicon in the region in which a thermoelectric conversion element is to be formed and where the first deep trenches and the second deep trenches are created so that remaining portions of the first deep trenches can be used as deep trenches for rods; and
filling the first deep trenches for rods with the thermoelectric conversion material, and
the coverage of the rods with the reinforcement layer is thermal oxidization of silicon in which a thermal oxide film is formed as the reinforcement layer.

12. The method for manufacturing a semiconductor device according to claim 11, wherein the second deep trenches are completely filled in with thermally oxidized $SiO_2$ in the thermal oxidization of silicon.

13. The method for manufacturing a semiconductor device according to claim 11, wherein gaps remain after the thermal oxidization of silicon where the second deep trenches are not completely filled in with thermally oxidized $SiO_2$.

14. The method for manufacturing a semiconductor device according to claim 11, wherein the first deep trenches and the second deep trenches are created only from the front surface side and the method further comprises removal of a region of the silicon wafer that corresponds to the region in which a thermoelectric conversion element is to be formed, and thus exposing the rods.

15. The method for manufacturing a semiconductor device according to claim 11, wherein the first deep trenches and the second deep trenches are created from two sides, a front surface side and a rear side, of the semiconductor wafer so that at least the first deep trenches penetrate through the semiconductor wafer.

16. The method for manufacturing a semiconductor device according to claim 11, wherein the filling of the first deep trenches with the thermoelectric conversion material is filling of the first deep trenches with the thermoelectric conversion material in accordance with an aerosol deposition method.

17. A method for manufacturing a semiconductor device comprising:
forming a number of rods of a thermoelectric conversion material on a front surface side of a region of a semiconductor wafer in which a thermoelectric conversion element is to be formed; and
covering the rods with an insulating reinforcement layer of which the thermal conductivity is lower than that of the semiconductor wafer, wherein the formation of a number of rods includes: creating deep trenches in the semiconductor wafer; and filling the deep trenches with the thermoelectric material,
the coverage of the rods with the insulating reinforcement layer includes:
removing the semiconductor layer from around the rods; and
depositing an insulating material of which the thermal conductivity is lower than that of the semiconductor wafer in a region from which the semiconductor layer has been removed.

18. The method for manufacturing a semiconductor device according to claim 17, wherein the filling of the deep trenches with the thermoelectric conversion material is filling of the deep trenches with the thermoelectric conversion material in accordance with an aerosol deposition method.

* * * * *